(12) United States Patent
Adachi

(10) Patent No.: US 10,850,923 B2
(45) Date of Patent: Dec. 1, 2020

(54) TRANSPORTER AND TRANSPORTING METHOD

(71) Applicant: Murata Machinery, Ltd., Kyoto (JP)

(72) Inventor: Naruto Adachi, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 123 days.

(21) Appl. No.: 16/338,509

(22) PCT Filed: Aug. 10, 2017

(86) PCT No.: PCT/JP2017/029097
§ 371 (c)(1),
(2) Date: Apr. 1, 2019

(87) PCT Pub. No.: WO2018/066230
PCT Pub. Date: Apr. 12, 2018

(65) Prior Publication Data
US 2019/0248581 A1 Aug. 15, 2019

(30) Foreign Application Priority Data
Oct. 7, 2016 (JP) .................................. 2016-198633

(51) Int. Cl.
*B65G 1/137* (2006.01)
*H01L 21/67* (2006.01)
(Continued)

(52) U.S. Cl.
CPC ............. *B65G 1/1373* (2013.01); *B65G 1/04* (2013.01); *H01L 21/67259* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 8,753,060 B2 * | 6/2014 | Ueda ...................... | B65G 35/00 414/277 |
| 10,643,876 B2 * | 5/2020 | Schober ............ | H01L 21/67389 |

(Continued)

FOREIGN PATENT DOCUMENTS

| | | |
|---|---|---|
| CN | 1597466 A | 3/2005 |
| CN | 101234701 A | 8/2008 |

(Continued)

*Primary Examiner* — Kyle O Logan
(74) *Attorney, Agent, or Firm* — DLA Piper LLP (US)

(57) ABSTRACT

A transporter that moves between a plurality of transfer destinations at which articles can be placed, and transfers the article to the transfer destination, the transporter including a transferer capable of extending to or retracting from the transfer destination, and that places the article at the transfer destination in a state of having extended to the transfer destination from a waiting position; a detector that detects, after the transporter has transferred the article to the transfer destination, before the transporter starts moving toward another transfer destination, and before the transporter has returned to the waiting position, a posture or a position of the article; and a determiner that determines whether or not the posture or the position of the article is within a preliminarily set appropriate range, on the basis of detection results of the detector.

19 Claims, 12 Drawing Sheets

(51) Int. Cl.
  *H01L 21/677* (2006.01)
  *B65G 1/04* (2006.01)
(52) U.S. Cl.
  CPC .. *H01L 21/67265* (2013.01); *H01L 21/67763* (2013.01); *H01L 21/67769* (2013.01); *B65G 2201/0297* (2013.01); *B65G 2203/0233* (2013.01); *B65G 2203/041* (2013.01); *B65G 2207/20* (2013.01)

(56) References Cited

U.S. PATENT DOCUMENTS

| | | | |
|---|---|---|---|
| 2005/0118010 A1 | 6/2005 | Ogawa et al. | |
| 2007/0059132 A1* | 3/2007 | Akamatsu | B65G 1/0421 414/274 |
| 2007/0134078 A1* | 6/2007 | Rogers | H01L 21/67769 414/281 |
| 2007/0207016 A1* | 9/2007 | Murata | B65G 1/04 414/281 |
| 2008/0063994 A1 | 3/2008 | Sugawara et al. | |
| 2008/0156069 A1* | 7/2008 | Murata | G01F 15/063 73/19.04 |
| 2008/0217278 A1* | 9/2008 | Murata | H01L 21/67766 212/224 |
| 2008/0304942 A1 | 12/2008 | Yazawa et al. | |
| 2009/0162176 A1* | 6/2009 | Link | B66F 9/07 414/659 |
| 2009/0238664 A1* | 9/2009 | Murata | H01L 21/67775 414/222.02 |
| 2011/0056901 A1 | 3/2011 | Kumazawa et al. | |
| 2011/0270438 A1* | 11/2011 | Shimamura | H05K 13/086 700/214 |
| 2012/0093620 A1* | 4/2012 | Murata | H01L 21/67769 414/281 |
| 2013/0175908 A1* | 7/2013 | Chang | H01L 21/67769 312/223.1 |
| 2013/0207811 A1 | 8/2013 | Yagawa | |
| 2013/0211571 A1 | 8/2013 | Teramoto et al. | |
| 2014/0056671 A1* | 2/2014 | Gambe | H01L 21/67769 414/267 |
| 2014/0072392 A1* | 3/2014 | Tanahashi | B66F 9/0755 414/277 |
| 2017/0183156 A1* | 6/2017 | Yoshioka | H01L 21/67769 |

FOREIGN PATENT DOCUMENTS

| | | |
|---|---|---|
| CN | 101597017 A | 12/2009 |
| CN | 102020090 A | 4/2011 |
| CN | 105269552 A | 1/2016 |
| JP | 02-095605 A | 4/1990 |
| JP | H10-59511 A | 3/1998 |
| JP | 2001-158507 A | 6/2001 |
| JP | 2008-214075 A | 9/2008 |
| JP | 2013-095587 A | 5/2013 |
| TW | 201012735 A | 4/2010 |
| TW | 201311529 A | 3/2013 |

* cited by examiner

TRANSPORTER AND TRANSPORTING METHOD

TECHNICAL FIELD

This disclosure relates to a transporter and a transporting method.

BACKGROUND

In manufacturing factories such as semiconductor manufacturing factories, articles such as transportation containers (FOUPs) for semiconductor wafers and reticle pods for transporting reticles are temporarily stored in an automated warehouse such as a stocker. The automated warehouse includes a transporter such as a stacker crane, and the transporter transfers articles to a storage rack, an incoming/outgoing port or the like. It has been proposed that to confirm articles that have been transferred to a storage rack, the presence of the articles on each storage rack is confirmed by acquiring images (video images) of the articles with a television camera provided on the transporter and the acquired imaged are used for stock management purposes (for example, see Japanese Unexamined Patent Application, First Publication No. H02-95605).

The transporter used for an automated warehouse is controlled to place an article at a predetermined position on a storage rack. However, sometimes, an article that is placed is displaced from a correct position due to some cause. In that instance, there is a possibility that the article cannot be appropriately held when the transporter later receives the article and it may cause the article to fall or may cause an incident similar thereto. Moreover, when the transporter cannot appropriately hold the article, an abnormality may be detected and the transporter may be stopped. When the transporter stops, an operator needs to enter the automated warehouse and check the situation, which is burdensome for the operator such as installing a scaffold. Also, operation of the automated warehouse is stopped while the operator is checking, and it reduces production efficiency of the manufacturing factory.

In view of the above circumstances, it could be helpful to provide a transporter and a transporting method capable of quickly and accurately detecting a posture or a position of an article placed on a storage rack at an appropriate timing.

SUMMARY

I thus provide:

A transporter that moves between a plurality of transfer destinations at which articles can be placed, and transfers the article to the transfer destination, the transporter comprising: a detector that detects, after the transporter has transferred the article to the transfer destination and before starts moving toward another transfer destination, a posture of the article or a position of the article at the transfer destination; and a determiner that determines whether or not the posture or the position of the article at the transfer destination is within a preliminarily set appropriate range, on the basis of detection results of the detector.

The determiner may perform a determination after the transporter has transferred the article to the transfer destination and before it starts moving toward another transfer destination. The determiner may perform a determination every time when the transporter places the article at the transfer destination. There may be included a transferer capable, at a waiting position, of extending to or retracting from the transfer destination in a state of holding the article on a distal end thereof, and that places the article at the transfer destination in a state of having extended to the transfer destination, and the detector may perform a detection after the transporter has placed the article at the transfer destination and before the transferer has returned to the waiting position. The transferer may be provided on an elevation platform that can be lifted or lowered, and the detector may be provided on the elevation platform. The detector may acquire images of the transfer destination and the article placed at the transfer destination, and may detect a posture of the article or a position of the article at the transfer destination on the basis of the images. An illuminator that illuminates the transfer destination and the article placed at the transfer destination may be included. The detector may detect a posture of the article or a position of the article at the transfer destination, on the basis of the images that captured indicators provided at the transfer destination and a characteristic portion of the article. There may be included a controller that performs a predetermined process when the determiner determines the posture or position of the article at the transfer destination as being out of the appropriate range.

My transporting method is a transporting method in which an article is moved between a plurality of transfer destinations at which the articles can be placed, and the article is transferred to the transfer destination, the transporting method comprising: detecting, after the article has been placed at the transfer destination, the posture of the article or a position of the article at the transfer destination; and determining whether or not the posture or the position of the article at the transfer destination is within a preliminarily set appropriate range, on the basis of the detection results.

According to the transporter and the transporting method, it is possible to quickly and accurately detect the posture or position of the article placed on a storage rack at an appropriate timing.

In the transporter in which the determiner performs determination after the transporter has transferred the article to the transfer destination and before starts moving toward another transfer destination, the transporter can quickly start moving toward another transfer destination. In the transporter in which the determiner performs a determination every time when the transporter places the article at the transfer destination, since a determination is performed every time when the article is placed on the transfer destination, it is possible to reliably determine the transferred article. In the transporter in which: there is included a transferer capable, at a waiting position, of extending to or retracting from the transfer destination in a state of holding the article on a distal end thereof, and that places the article at the transfer destination in a state of having extended toward the transfer destination; and the detector performs a detection after the transporter has placed the article at the transfer destination and before the transferer has returned to the waiting position, since a detection is performed while the transferer is performing the transfer operation, it is possible to reduce loss of transporting time associated with detection. Since the transporter includes the above transferer, the transferer can be made in a compact size. In the transporter in which the transferer is provided on the elevation platform that can be lifted or lowered and the detector is provided on the elevation platform, since the transferer and the detector are both provided on the elevation platform, the detector can perform a detection quickly without moving from the position at the time of transfer. In the transporter in which the detector acquires images of the transfer destination and the article placed at the transfer destination, and detect a posture of the article or a position of the article at the transfer destination on the basis of the images since much information on the posture or the position of the article is contained in comparison with determination performed by a sensor, it is possible to perform an accurate determination. Moreover, in the transporter, since the detector performs a detection on the basis of images, it can be applied to articles of different sizes or shapes. In the transporter including the illuminator that illuminates the transfer destination and the article placed at the transfer destination, since the illuminator reliably illuminates the transfer destination and the article placed at the transfer destination, it is possible to perform an accurate detection by the detector. In the transporter in which the detector detects a posture of the article or a position of the article at the transfer destination, on the basis of the images that captured indicators provided at the transfer destination and a characteristic portion of the article, since detection is performed on the basis of the indicators and the characteristic portion, it is possible to perform accurate detection by the detector. In the transporter in which a predetermined process is performed when the determiner determines the posture or the position of the article at the transfer destination as being out of the appropriate range, it is possible to perform an appropriate process on an abnormally placed article.

DESCRIPTION OF REFERENCE SIGNS 1, 1A Transporter
2 Article
4 Storage rack (transfer destination)
12 Elevation platform
13 Transferer
14,14a to 14f Detector
15, 15a to 15f Illuminator
27, 27a, 27b Indicator
28 Characteristic portion
37 Controller
39 Image processor
40 Determiner
S, SA Automated warehouse

DETAILED DESCRIPTION

The following describes examples with reference to the drawings. In the following drawings, an XYZ coordinate system is used to describe the directions in each drawing. In the XYZ coordinate system, the vertical direction is taken as the Z direction, and the horizontal directions are taken as the X direction and the Y direction. Also, in each of the X, Y, and Z directions, the side pointed by arrow is referred to as the + side (for example, +X side) and the opposite side thereof is referred to as the − side (for example, −X side) as appropriate.

First Example

Figure 1:
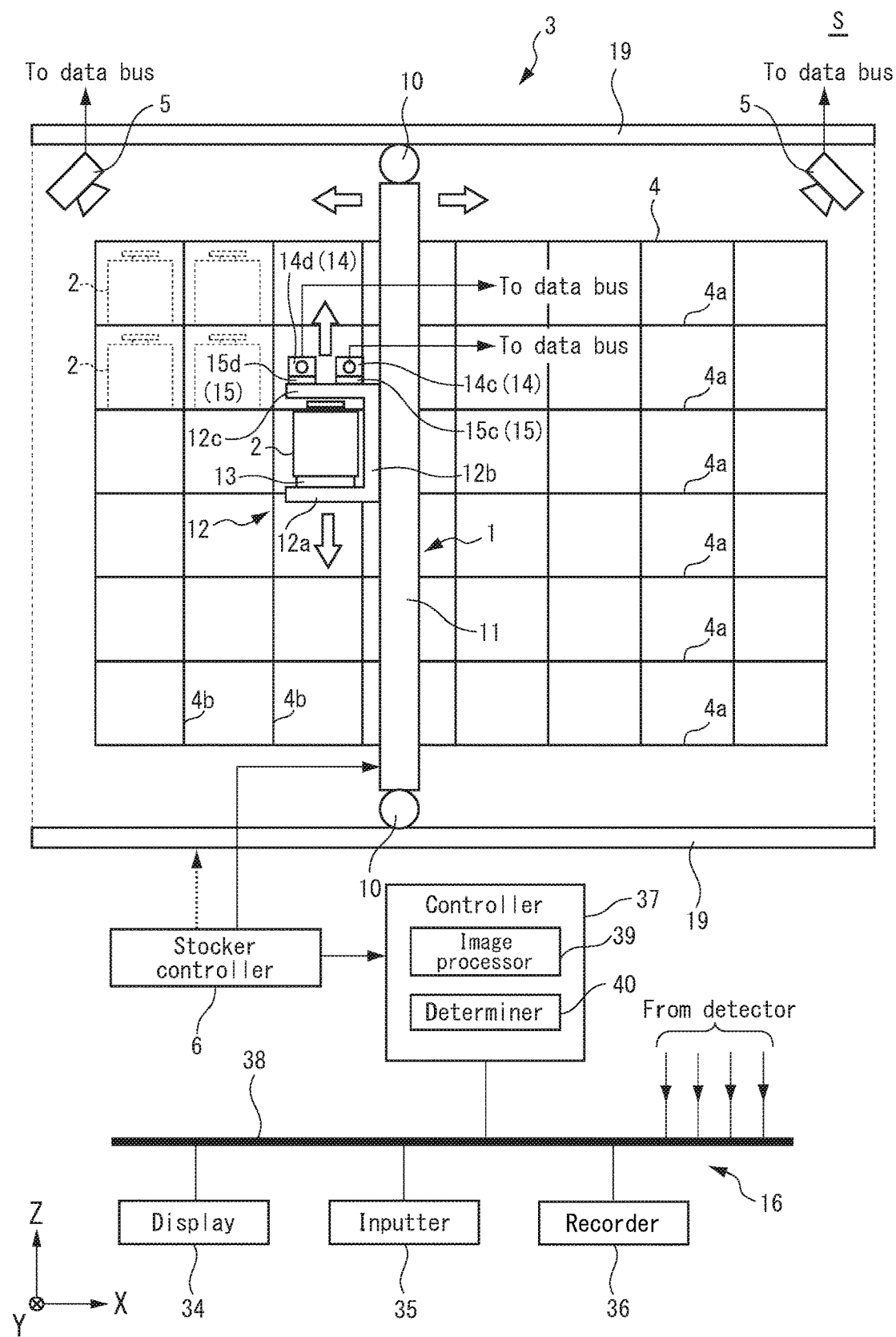
FIG. 1 is a front elevation view conceptually showing an example of an automated warehouse to which a transporter is applied.
Figure 2:
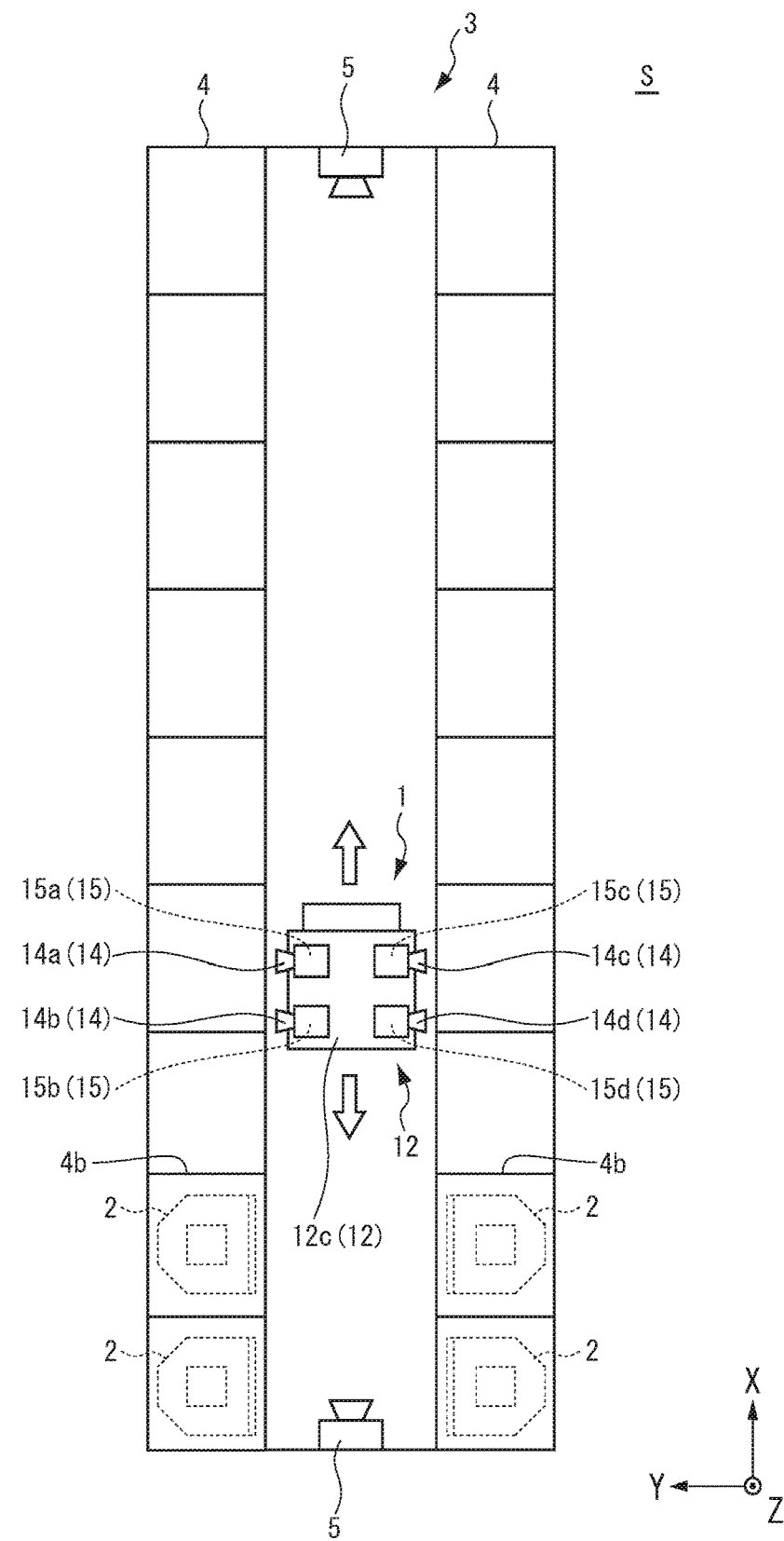
FIG. 2 is a top view showing the automated warehouse of FIG. 1.
Figure 3:
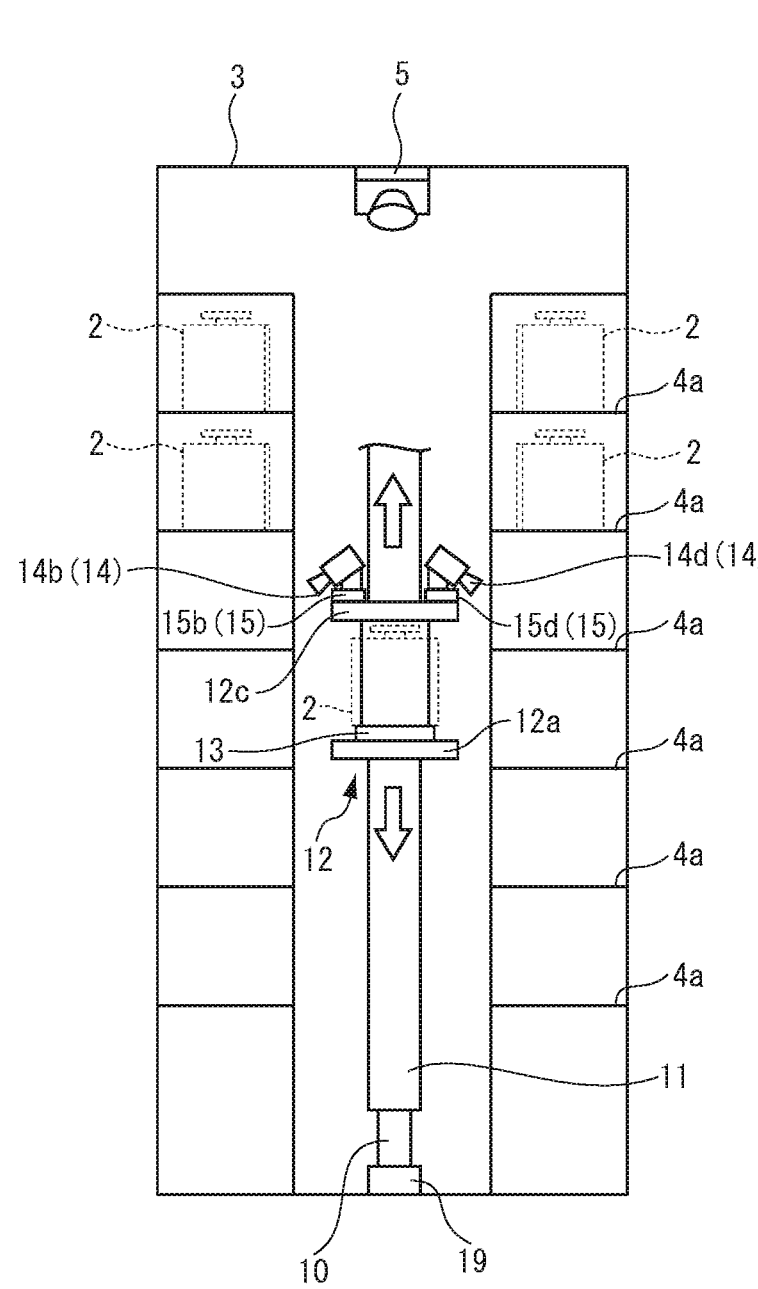
FIG. 3 is a top view showing the automated warehouse of FIG. 1.
Figure 3:
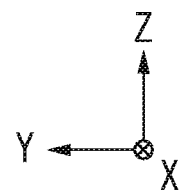

FIG. 1 to FIG. 3 are diagrams conceptually showing an example of an automated warehouse to which a transporter is applied. FIG. 1 is a front elevation view as seen from the −Y side. FIG. 2 is a top view as seen from the +Z side. FIG. 3 is a side view as seen from the −X side. A transporter 1 is a stacker crane used in an automated warehouse S (stocker). The automated warehouse S is, for example, installed in a semiconductor manufacturing factory and stores articles 2, examples of which include a container such as a FOUP accommodating semiconductor wafers and a reticle pod accommodating a processing member such as a reticle.

A transporter 1 moves between a plurality of transfer destinations at which articles 2 can be placed, and transfers the article 2 to the transfer destination. The X direction is a direction in which the transporter 1 moves, and the Y direction is a direction in which the transporter 1 delivers the article 2. The transporter 1 is assumed as being a stacker crane. However, the transporter 1 need not be a stacker crane. In addition, the article 2 is described as a FOUP, however, the article 2 need not be a FOUP. For example, the article 2 may be various kinds of articles handled at a facility where the automated warehouse S is installed. Also, the transporter 1 and the automated warehouse S can be applied to facilities of fields other than the semiconductor field.

The automated warehouse S includes the transporter 1, a housing 3, storage racks 4 (transfer destinations), image capturers 5, and a stocker controller 6. The transporter 1 will be described later. The housing 3 has an internal space that can be isolated from the outside. The housing 3 includes an incoming/outgoing port (not shown in the figures) through which the articles 2 are transferred between the outside of the housing 3 and the internal space.

The storage racks 4 are arranged inside the housing 3. The storage rack 4 is provided in a plurality of positions, and arranged on both sides (+Y side and −Y side) of a direction (Y direction) intersecting the moving direction (X direction) of the transporter 1. Each storage rack 4 has a plurality of racks 4a arranged in a vertical direction (Z direction) and a plurality of vertical plates 4b arranged in a horizontal direction (X direction). On each rack 4a there can be placed the article 2. Also, on each rack 4a there can be placed a plurality of articles 2.

The image capturers 5 are arranged inside the housing 3. The image capturers 5 are used to monitor the inside of the housing 3. The image capturers 5 are provided on the +X side and the −X side of an upper part of the housing 3. Each image capturer 5 captures and acquires images of the transporter 1 and the storage racks 4. Each image capturer 5 is, for example, a digital camera (digital video camera) that acquires images or motion images as digital data. Each image capturer 5 is connected to a data bus 38 to be capable of communicating therewith in a wired or wireless manner. Each image capturer 5 outputs the data of captured images to the data bus 38. The image data output from each image capturer 5 is recorded in a recorder 36. Whether or not the automated warehouse S includes the image capturers 5 is optional.

The stocker controller 6 controls and manages respective parts of the automated warehouse S including the transporter 1. The stocker controller 6, for example, controls operation of each part of the transporter 1 and manages storage history of the articles 2 and so forth on the storage racks 4. The stocker controller 6 is arranged outside the housing 3. The stocker controller 6 is configured with a computer device including a CPU, a memory storage device such as a main memory and a hard disk, a wired or wireless communication device, an input device such as a keyboard or a mouse, and a display device such as a display. The computer device reads various programs stored in the memory storage device and executes processes according to the programs. The stocker controller 6 is connected to each part of the automated warehouse S to be capable of communicating therewith in a wired or wireless manner. Also, the stocker controller 6 is connected to a controller 37 of a manager 16 to be capable of communicating therewith in a wired or wireless manner. The stocker controller 6 may be arranged inside or outside the housing 3.

The transporter 1 is arranged inside the housing 3. The transporter 1 travels along tracks 19 and transfers the article 2. The transporter 1 includes traveling bodies 10, a mast 11, an elevation platform 12, a transferer 13, detectors 14, illuminators 15, and the manager 16.

The traveling bodies 10 travel along the tracks 19. The tracks 19 are provided in an upper part and a lower part within the housing 3 respectively. The upper and lower tracks 19 are both provided between the storage racks 4 on the +Y side and the −Y side (not shown in the figure). The upper and lower tracks 19 are each arranged in a direction parallel to the X direction. The traveling bodies 10 travel in a direction substantially parallel to the tracks 19 (in the X direction in FIG. 1). The traveling bodies 10 each have a traveling driver such as an electric motor, a speed reducer, a drive wheel, an encoder and so forth. The drive wheel is arranged to be in contact with the track 19 and is connected to an output axis of the electric motor (the traveling driver) via the speed reducer. Rotation of the output axis of the electric motor is transmitted to the drive wheel via the speed reducer, and rotation of the drive wheel drives each traveling body 10 to travel. The encoder detects the rotation speed of the output axis of the electric motor and outputs the detection result to the stocker controller 6. The stocker controller 6 controls rotation of the electric motor on the basis of detection results of the encoder and controls the speed or the stop position of the traveling bodies 10. The setting of the stop position for the traveling bodies 10 may be performed by identifying an indicator plate or the like that is preliminarily installed along the tracks 19. Moreover, the traveling driver (the electric motor) may be a rotary type motor, and a linear motor may also be used therefor.

Between the upper traveling body 10 and the lower traveling body 10 there is attached a mast 11 that extends vertically. The mast 11 moves integrally with the upper traveling body 10 and the lower traveling body 10.

The elevation platform 12 ascends or descends along the mast 11. The elevation platform 12 includes a base 12a, a strut 12b, and a top plate 12c. The base 12a is arranged under the elevation platform 12. The base 12a supports each part of the elevation platform 12. The strut 12b is arranged on the +X side of the base 12a. The strut 12b extends vertically upward from the base 12a. The strut 12b is connected, on the +X side thereof, to the mast 11 via a connector (not shown in the figures). The elevation platform 12 is guided in the vertical direction by the mast 11. The top plate 12c is arranged above the elevation platform 12. Between the base 12a and the top plate 12c there is formed a space in which the article 2 can be placed. The top plate 12c is supported from below by the strut 12b. The top plate 12c is used to support objects such as the detectors 14 and to prevent the article 2 from falling off.

The elevation platform 12 is suspended from above by suspenders such as wires or the like. The transporter 1 includes a lift driver (not shown in the figures) that drives the suspenders. The lift driver feeds out or winds up the suspenders. When the lift driver winds up the suspenders, the elevation platform 12 is lifted and guided by the mast 11. Also, when the lift driver feeds out the suspenders, the elevation platform 12 is lowered and guided by the mast 11. The configuration of the elevation platform 12 is not limited to the example of FIG. 1, and is optional. For example, the elevation platform 12 need not include the top plate 12c.

Figure 4:
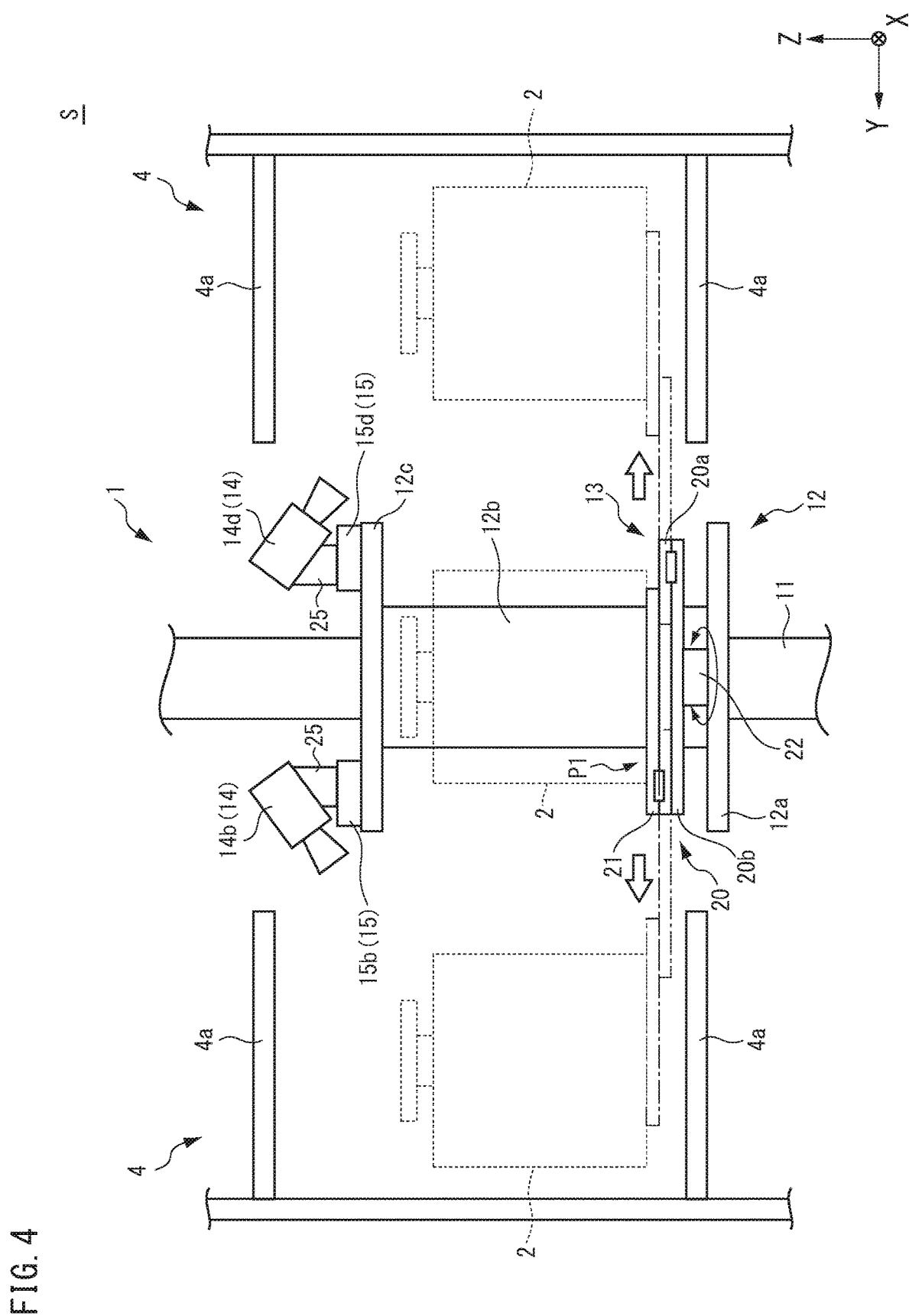
FIG. 4 is a side view showing an elevation platform and a transferer.
Figure 5:
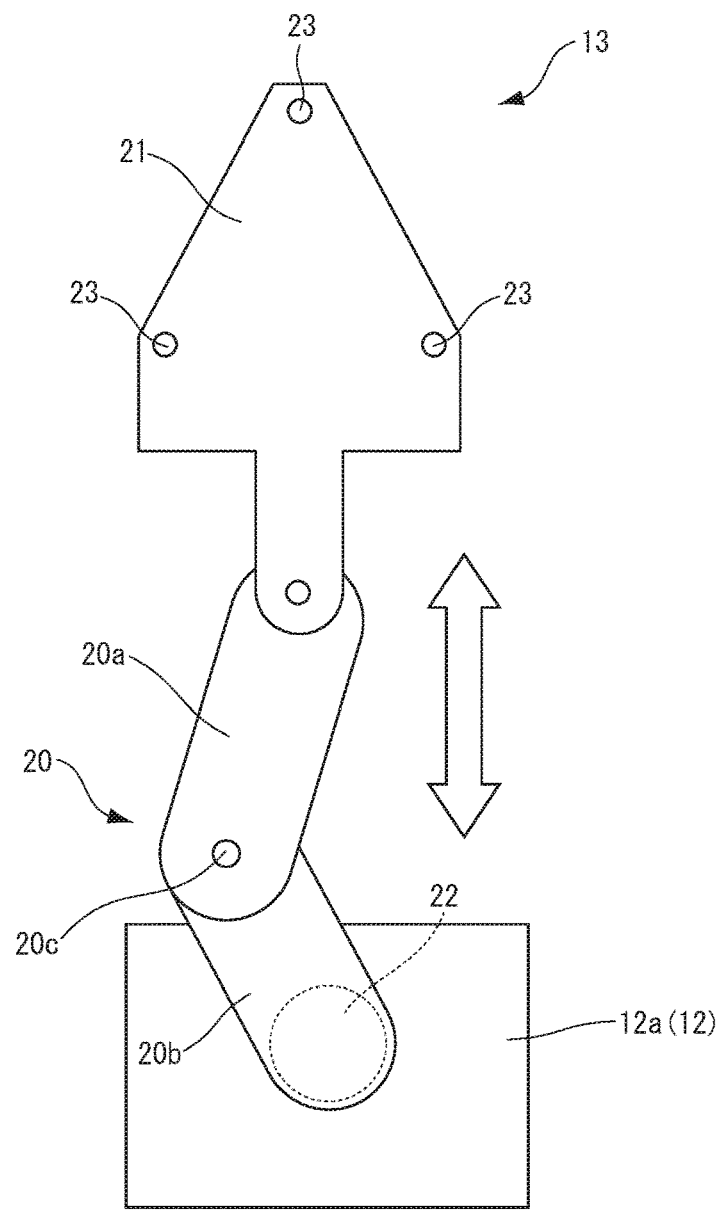
FIG. 5 is a top view showing an arm.

The transferer 13 is provided on the elevation platform 12. FIG. 4 is a side view showing the elevation platform and the transferer as seen from the −X side. The transferer 13 includes an arm 20, a holder 21, and a rotation driver 22. FIG. 5 is a top view showing the arm. The arm 20 is of a structure in which arms 20a, 20b are connected via a joint 20c. The arm 20 can extend and contract in a horizontal direction that includes the Y direction as the arms 20a, 20b bend at the joint 20c. A proximal end side of the arm 20 is connected to the rotation driver 22.

The holder 21 is rotatably connected to a distal end side of the arm 20. The holder 21 can hold the article 2 on an upper surface thereof. The holder 21 has a plurality of (for example, three) pins 23 (for example, kinematic pins) used to position the article 2. A plurality of grooves used (not shown in the figures) for positioning are radially formed on a bottom surface of the article 2. When the holder 21 holds the article 2, the plurality of pins 23 of the holder 21 each enter the grooves on the bottom surface of the article 2 and, thereby, the article 2 is positioned on the upper surface of the holder 21. The holder 21 supports the article 2 in a state where the article 2 is positioned. The rotation driver 22 is arranged on the elevation platform 12 and rotates the arm 20 and the holder 21 about an axis parallel to the vertical direction.

As shown in FIG. 4, the holder 21 is arranged on the elevation platform 12 in a state where the arm 20 is retracted. The position of the arm 20 and the holder 21 in such a state is referred to as waiting position P1. When the transferer 13 transfers the article 2 to the storage rack 4, the holder 21 is positioned at the waiting position P1 in the state of holding the article 2. Then, in the transferer 13, the arm 20 extends from the waiting position P1 to either the +Y side or the −Y side. The extending direction of the arm 20 is changed to the +Y side or to the −Y side by rotation of the rotation driver 22. When delivering the article 2 to the transfer destination, the transferer 13 extends the arm 20 in a state of having been positioned with respect to the transfer destination, and positions the article 2 on the holder 21 above the transfer destination. Then, by lowering the elevation platform 12, the article 2 is delivered to the transfer destination from the holder 21. As seen above, the transferer 13 places the article 2 at the transfer destination in the state of having been extended toward the transfer destination on the +Y side or the −Y side. Moreover, after having transferred the held article 2, the arm 20 is retracted and the holder 21 is positioned at the waiting position P1.

When the transferer 13 receives the article 2 from a transfer origin such as the storage rack 4, the holder 21 is positioned at the waiting position P1 in the state of not holding the article 2. The arm 20 then extends toward the article 2 placed at the transfer origin, and the holder 21 is positioned below the bottom surface of the article 2. Then, in the transferer 13, the holder 21 picks up the article 2 as the elevation platform 12 is lifted. Then, in the transferer 13, the arm 20 is retracted with the article 2 being held on the holder 21, the arm 20 and the holder 21 are moved to the waiting position P1, and the article 2 is held on the elevation platform 12. As described above, the transferer 13 is capable, from the waiting position P1, of extending toward the transfer destination in the state of holding the article 2 on the distal end thereof (holder 21), and places the article 2 at the transfer destination in the state of having extended toward the transfer destination. In such an example, the transferer 13 can be made in a compact size.

The transferer 13 shown in FIG. 1 is merely an example, and may be of another configuration. For example, the transferer 13 may grasp a flange 2c provided on the upper part of the article 2 (see FIG. 8) to hold the article 2, or may sandwich sides of the article 2 to hold the article 2. Moreover, the transferer 13 is not limited to use of the arm 20 described above and, for example, an articulated robot arm or the like may be used therefor.

Next, the detectors 14 will be described. As shown in FIG. 1, the detectors 14 are provided on the elevation platform 12. The detectors 14 detect the transfer destination and the posture or a position of the article 2 placed at the transfer destination. The detectors 14 are image capturing devices such as a camera and a video camera, or sensors capable of measuring a distance, a position, a displacement and so forth. The description is based on the assumption that the detectors 14 are image capturing devices. The detectors 14 are, for example, digital cameras (digital video cameras) that acquire images or motion images as digital data. The detectors 14 may each include an auto focusing mechanism, a zooming mechanism, a flash and the like.

As shown in FIG. 2, the detectors 14 include a plurality of detectors 14a to 14d. The detectors 14a, 14b are provided on the +X side and the −X side respectively, on the +Y side of the top plate 12c. The detectors 14a, 14b are oriented toward the +Y side respectively, and each detects the +Y side. The detectors 14c, 14d are provided on the +X side and the −X side respectively, on the −Y side of the top plate 12c. The detectors 14c, 14d are oriented toward the −Y side respectively, and each detects the −Y side.

Figure 6:
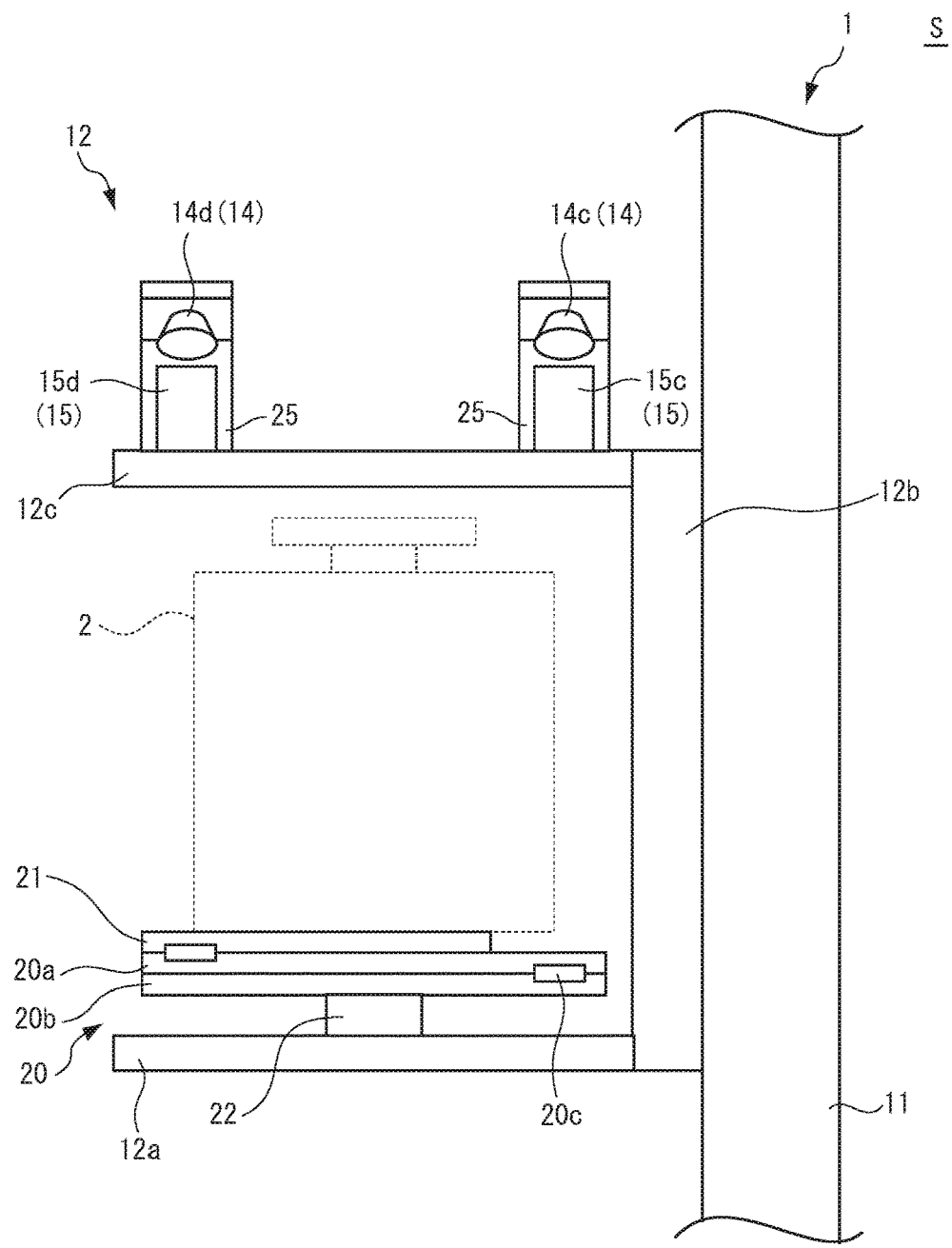
FIG. 6 is a front elevation view showing the elevation platform and detectors.

FIG. 6 is a front elevation view of the elevation platform and detectors as seen from the −Y side. The detectors 14c, 14d are each provided on the top plate 12c via a support member 25. Also, the detectors 14c, 14d are each supported on the support member 25 to be oriented diagonally downward at a predetermined angle, and each perform image-capturing from diagonally above. Thereby, the detectors 14c, 14d can image-capture the elevation platform 12 side of the article 2 placed on the storage rack 4 (the −Y side in FIG. 6) and the elevation platform 12 side of the storage rack 4. Therefore, the detectors 14 can reliably image-capture the elevation platform 12 side of the article 2 placed on the storage rack 4 and the elevation platform 12 side of the storage rack 4. Moreover, when the detectors 14 image-capture from diagonally above, the detectors 14 are positioned above the elevation platform 12, and it is therefore possible to suppress an increase in the size in the horizontal direction due to the installation of the detectors 14. Further, the detectors 14c, 14d are respectively oriented toward the +X side and the −X side of the article 2 placed at the transfer destination, and the orientations thereof in the X direction are adjusted to perform image-capturing with focus on the +X side portion and the −X side portion of the article 2.

The detectors 14c, 14d are not limited to the postures described above and, for example, may be oriented in the horizontal direction as will be described later with reference to FIG. 11. Moreover, the detectors 14c, 14d may each be of a configuration in which the postures thereof are movable by a driving device. When employing such a configuration, the postures of the detectors 14c, 14d may be controlled by controlling the driving of the driving device by operation instructions from the stocker controller 6 or the manager 16.

As shown in FIG. 2, the illuminators 15 include a plurality of illuminators 15a to 15d. The illuminators 15a, 15b are provided on the +X side and the −X side respectively, on the +Y side of the top plate 12c. The illuminators 15a, 15b are provided being oriented toward the +Y side of the top plate 12c respectively, and each illuminate the +Y side. The illuminators 15c, 15d are provided on the +X side and the −X side respectively, on the −Y side of the top plate 12c. The illuminators 15c, 15d are oriented toward the −Y side of the top plate 12c respectively, and each illuminate the −Y side.

As shown in FIG. 6, the illuminators 15c, 15d are arranged in the vicinity of the detectors 14c, 14d, respectively. The illuminators 15c, 15d are provided below and on the −Y side (the transfer destination side) of the detectors 14c, 14d, respectively. When the detectors 14c, 14d perform detection, the illuminators 15c, 15d illuminate the transfer destination and the article 2 placed at the transfer destination. A light emitting element such as an LED is used for the illuminator 15b. The illuminators 15c, 15d are oriented toward the direction in which the detectors 14c, 14d perform detection (toward the −Y side in FIG. 6), respectively. The illuminator 15b is arranged to illuminate the article 2 placed at the transfer destination at a predetermined angle.

The illuminators 15c, 15d are connected to the stocker controller 6 to be able to communicate therewith (see FIG. 1). In the illuminators 15c, 15d, the ON/OFF timing of illumination, the intensity of illumination light are controlled by the stocker controller 6. In FIG. 6, the detectors 14c, 14d and the illuminators 15c, 15d on the −Y side are shown. However, the detectors 14a, 14b and the illuminators 15a, 15b on the +Y side (see FIG. 2) are also configured in the same manner as that of the detectors 14c, 14d and the illuminators 15c, 15d. When the detectors 15 that illuminate the transfer destination and the article 2 placed at the transfer destination, when the detectors 14 perform detection, the illuminators 15 reliably illuminate the transfer destination and the article 2 placed at the transfer destination and, as a result, the detectors 14 can accurately detect the posture of the article 2 or the position of the article 2 at the transfer destination. Note that whether or not the transporter 1 includes the illuminators 15a to 15d is arbitrary.

Next, acquisition of images of the article 2 performed by the detectors 14a to 14d will be described. The detectors 14a to 14d each acquire images of at least the elevation platform 12 side of the article 2 placed on the storage rack 4 (the −Y side in FIG. 7) and the elevation platform 12 side of the storage rack 4. The detectors 14a to 14d detect the posture of the article 2 or the position of the article 2 at the transfer destination, on the basis of the images that captured indicators 27 and characteristic portions 28 of the article 2.

Figure 7:
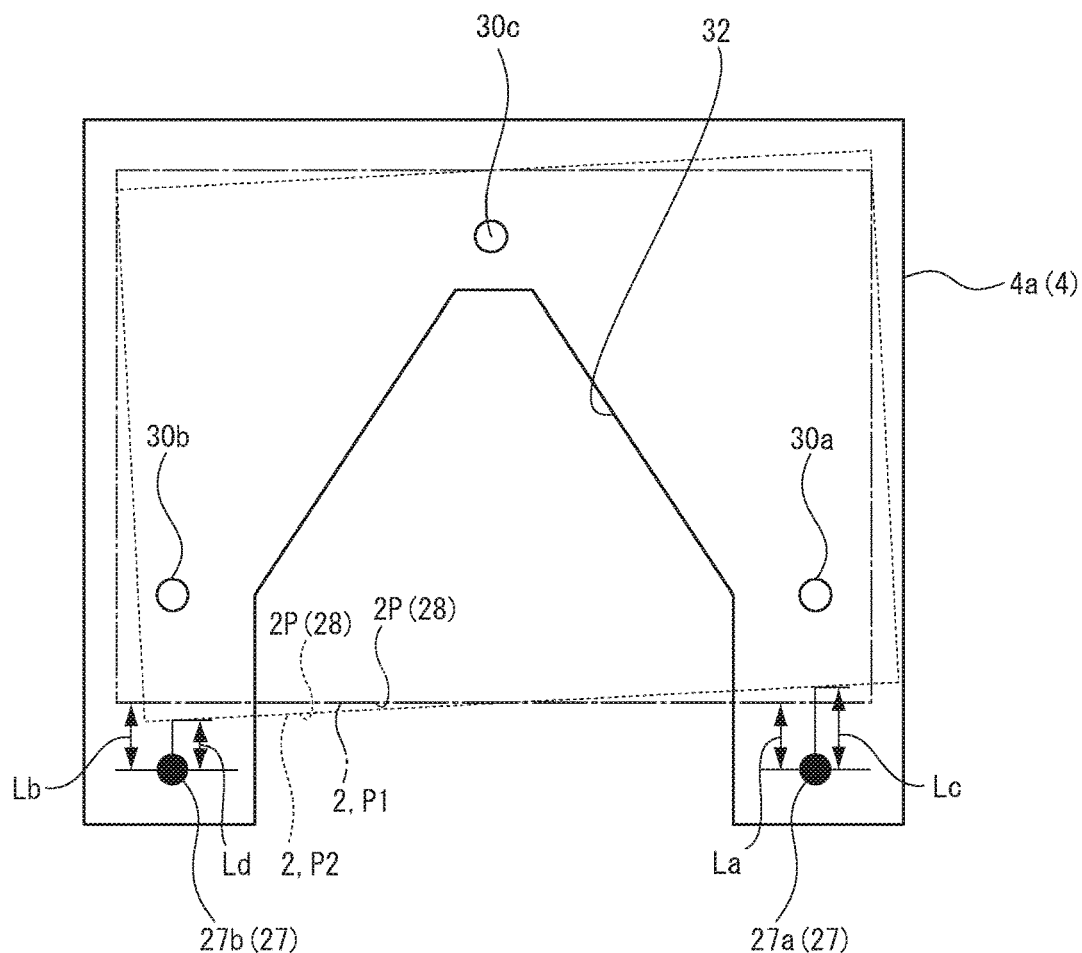
FIG. 7 is a top view showing a part of a storage rack.

FIG. 7 is a top view showing an enlarged view of a part of the storage rack. On the rack 4a, for each placement portion for a single article 2, there are provided pins 30a to 30c, a cutout 32, and indicators 27. The plurality of (for example, three) pins 30a to 30c are, for example, kinematic pins and used to position the article 2. The plurality of pins 30a to 30c are provided at predetermined positions on the rack 4a, respectively. The pin 30a is provided at a predetermined position on the +X side of the elevation platform 12 side (−Y side), on the rack 4a. The pin 30b is provided at a predetermined position on the −X side of the elevation platform 12 side (−Y side), on the rack 4a. The pin 30c is provided at a predetermined position in the center portion in the −X side, on the side away from the elevation platform 12 (+Y side), on the rack 4a.

The cutout 32 allows the holder 21 of the transferer 13 (see FIG. 5) to pass therethrough in the vertical direction. The cutout 32 is formed in a shape larger than the holder 21 when viewed from above to include backlash therein when the holder 21 is inserted. When the article 2 is transferred to the storage rack 4 by the transferer 13, the holder 21 moves downward from above the cutout 32 to perform the transfer operation of the article 2. The plurality of pins 30a to 30c provided on the rack 4a are each inserted into positioning grooves in the bottom surface of the article 2, and the article 2 is thereby positioned on the rack 4a. The article 2 is placed on the rack 4a in the state of being positioned.

The indicators 27 have a plurality of indicators 27a, 27b. The indicators 27a, 27b are formed so that they can each be image-captured by the detectors 14. For example, the indicators 27a, 27b are colored circular marks, respectively. The indicators 27a, 27b are each set to a color that can be identified when they are image-captured. The indicators 27a, 27b are each provided at a predetermined angle and a predetermined distance with respect to the two pins 30a, 30b on the elevation platform 12 side (on the −Y side), among the plurality of pins 30a to 30c. Also, the indicator 27a is arranged so that the straight line connecting the indicator 27a and the pin 30a is at a predetermined angle (parallel to the Y direction) with respect to the Y direction. The positional relationship between the indicator 27b and the pin 30b is the same as the positional relationship between the indicator 27a and the pin 30a.

Normally, the article 2 is formed in a predetermined size. Normally, an end part 2P of the article 2 on the elevation platform 12 side forms a straight line parallel to the X direction when viewed from above. The end part 2P is set as the characteristic portion 28. When the article 2 is placed at a correct position P1, the distance La between the indicator 27a and the end part 2P and the distance Lb between the indicator 27b and the end part 2P are the same predetermined value. On the other hand, when the article 2 is placed at a position P2 that is displaced from the correct position P1 in the horizontal direction (in the XY-plane direction in FIG. 7), the distance Lc between the indicator 27a and the end part 2P and the distance Ld between the indicator 27b and the end part 2P are different values. In such an example, the displacement of the article 2 in the horizontal direction can be quantitatively detected on the basis of the distance Lc and the distance Ld. Also, when the end part 2P is displaced in the vertical direction, the displacement of the article 2 in the vertical direction (in the Z direction) can be quantitatively detected on the basis of the value of the inclination of the end part 2P with respect to the horizontal plane (the XY plane in FIG. 7).

At least one of the size, the shape, the color, the number, and the position of the indicators 27 is not limited to the example shown in FIG. 7 and can be arbitrarily set. For example, the indicators 27 may be straight lines arranged at predetermined positions. Also, the number of the indicators 27 is not limited to two, and may be one, or three or more, for example. Whether or not the transporter 1 includes the indicators 27 is arbitrary, and the indicators 27 need not be included, for example. The characteristic portion 28 is not limited to the end part 2P shown in FIG. 7 and can be arbitrarily set. For example, the characteristic portion 28 may be a step 2d described later with reference to FIG. 8. Also, the number of the characteristic portion 28 need not be one. For example, the number of the characteristic portions 28 may be plural.

Figure 8:
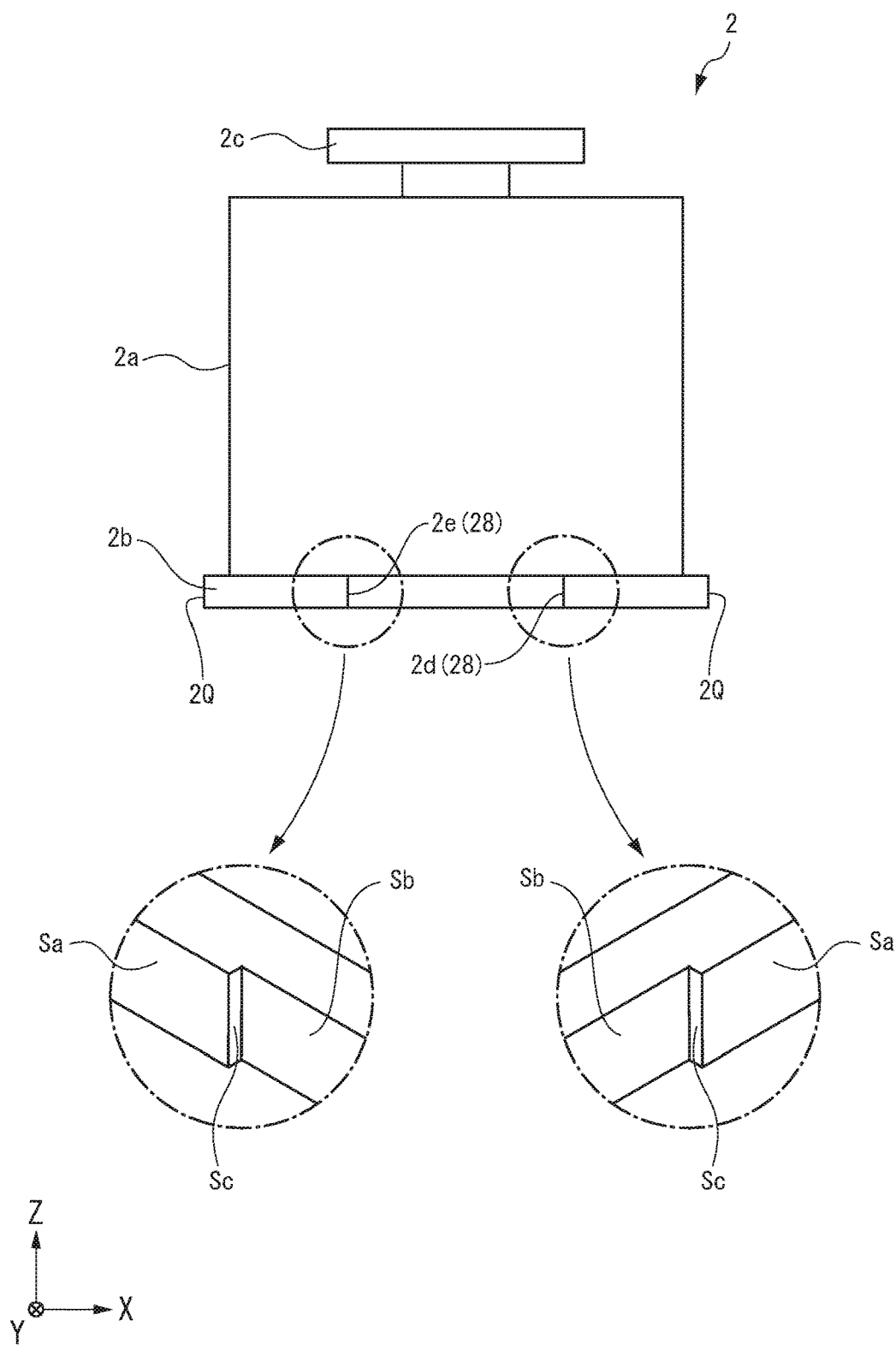
FIG. 8 is a side view showing an article.

FIG. 8 is a side view of the article as seen from the −Y side. In the article 2 of FIG. 8, an under flange 2b is composed of a transparent material. For the article 2, a member composed of a transparent material may be used in some instances. The article 2 has a main body 2a capable of accommodating semiconductor wafers therein, the under flange 2b provided at a lower part of the main body 2a, and the flange 2c provided at an upper part of the main body 2a. A +X side end part 2Q and a −X side end part 2Q of the under flange 2b are each formed in an R shape. Moreover, in the under flange 2b, at predetermined positions in the +X side portion thereof and the −X side portion thereof, there are formed steps 2d, 2e each protruding in a direction parallel to the Y direction. As shown in the enlarged view of FIG. 8, the steps 2d, 2e are each formed with: a surface Sa parallel to the XZ planes positioned on the +X side and the +X side of the under flange 2b; a surface Sb parallel to the XZ plane positioned between the surface Sa and the surface Sb; and a step surface Sc parallel to the YZ plane formed between the surface Sa and the surface Sb.

When the article 2 (for example, the under flange 2b) is composed of a transparent material as described above, it may be difficult in some examples to image-capture the main body 2a that corresponds to the edges of the article 2, or the characteristic portion 28 such as the X side end part and the Z side end part of the under flange 2b (for example, the end part 2P shown in FIG. 7). In such an example, it is possible to clearly image-capture the steps 2d, 2e by adjusting the emission angle of the illumination light emitted by the illuminator 15. Moreover, it may be difficult to perform image-capturing when the edges of the article 2 are formed in round shapes such as an R shape (for example, the end part 2Q shown in FIG. 8). Thus, when the article 2 is composed of a transparent material or when the edges thereof are formed in R shapes, it may be difficult for the detectors 14 to image-capture the characteristic portions 28 such as the edges. Therefore, the above steps 2d, 2e other than the edges of the article 2 may be used as the characteristic portions 28.

Figure 9:
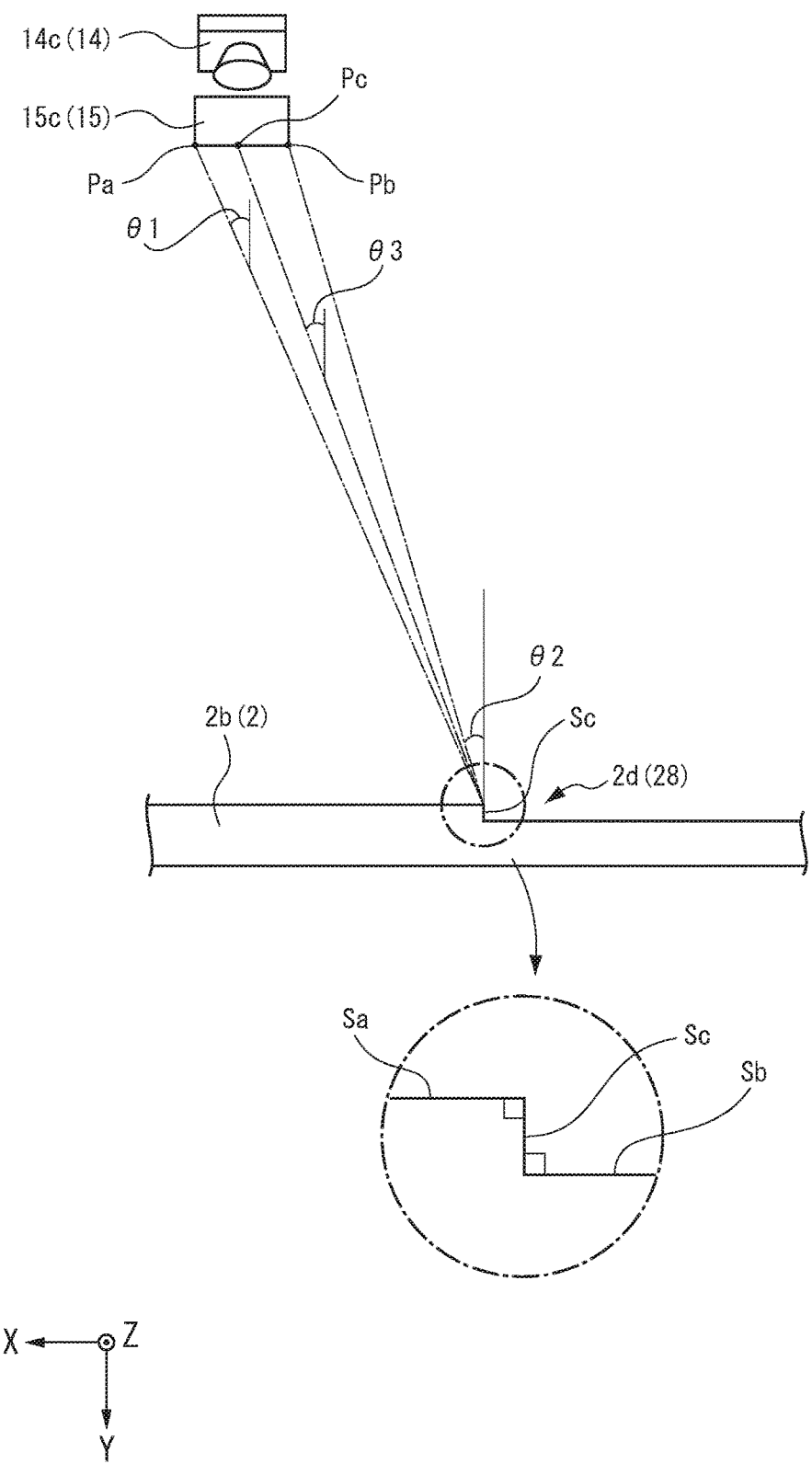
FIG. 9 is a top view showing a positional relationship between the article, the detector, and illuminator.

FIG. 9 is a top view showing a positional relationship between the article, the detector, and the illuminator. In this example, the detector 14c provided on the +X side image-captures the +X side of the article 2 including the step 2d and the +X side indicator 27a (see FIG. 7). On the transfer destination side (the +Y side) of the illuminator 15c, a +X side end position thereof is taken as a position Pa, a −X side end position is taken as a position Pb, and the center between the position Pa and the position Pb is taken as position Pc. Moreover, angles formed by the positions Pa to Pc with respect to the step surface Sc are defined as θ1, θ2, and θ3, respectively. When θ1, θ2, and θ3 are set such that 13°≤θ1, θ2, θ3≤18° and the detector 14c is arranged in the vicinity of the illuminator 15c on the −Y side, the step 2d can be clearly image-captured. While FIG. 9 shows the positional relationship between the detector 14c, the illuminator 15c, and the step 2d provided on the +X side, the positional relationship between the detector 14d, the illuminator 15d, and the step 2e provided on the −X side is also set symmetric to that shown in FIG. 9, and the detector 15d detects the step 2e. Also, the positions (sizes) of the detectors 14a, 14b and the illuminators 15a, 15b on the +Y side to clearly image-capture the steps 2d, 2e are respectively the same as the positions (sizes) of the detectors 14c, 14d and the illuminators 15c, 15d on the −Y side. The positions of the detectors 14 (14a to 14d) (hereinafter, simply referred to as respective detectors 14) and the illuminators 15 (15a, 15b) (hereinafter, simply referred to as respective illuminators 15) are not limited to the positions shown in FIG. 9, and can be arbitrarily set. For example, in FIG. 9, the example is shown in which the detector 14c provided on the +X side image-captures the +X side of the article 2. However, this disclosure is not limited to this example. For example, the detectors 14c, 14d may respectively detect the +X side and the −X side of the article 2.

The steps 2d, 2e are image-captured linearly by the detectors 14c, 14d, respectively. For example, when the article 2 is placed displaced in the horizontal plane direction, the position (or the distances) of the step 2d with respect to the indicators 27a, 27b shown in FIG. 7 differs from that when the article 2 is correctly positioned, and it is possible, on the basis of the difference amount, to quantitatively detect the displacement of the article 2 in the horizontal direction (the direction parallel to the XY plane in FIG. 8). Also, since the step 2d is linear in the images captured by the detectors 14c, 14d, it is possible, on the basis of the values of the inclinations of the steps 2d, 2e with respect to the horizontal plane, to quantitatively detect the displacement of the article 2 in the vertical direction (the Z direction). Therefore, such steps 2d, 2e can be set as the characteristic portions 28.

The respective detectors 14 detect, after the transporter 1 has transferred the article 2 to the transfer destination and before starts moving toward another transfer destination, the posture of the article 2 or the position of the article 2 at the transfer destination. In such an example, it is possible to accurately and efficiently detect the posture of the article 2 or the position of the article 2 at the transfer destination. The respective detectors 14 detect the posture or the position of the transferred article 2, for example, immediately after transfer of the article 2 to the transfer destination has been completed by the transferer 13. In such an example, the respective detectors 14 can perform detection more quickly. For example, in the transfer operation described above, the respective detectors 14 detect the posture or the position of the transferred article 2, for example, immediately after the holder 21 has moved to the lowest point of the lower side from the upper side of the cutout 32 and the transfer operation of the article 2 has been completed. For example, the respective detectors 14 perform detection after the article 2 has been placed at the transfer destination and before the transferer 13 has returned to the waiting position P1 from the state of being extended. When the respective detectors 14 perform detection after the article 2 has been placed at the transfer destination and before the transferer 13 has returned to the waiting position P1 from the state of being extended, since detection is performed while the transferer 13 is performing the transfer operation, it is possible to reduce the loss in transportation time associated with detection.

Moreover, in addition to the detection of the posture or the position of the transferred article 2 described above, the respective detectors 14 can detect and confirm the posture or the position of the article 2 being held by the holder 21. The confirmation is performed during the transfer operation (while the article 2 is being transferred from the transfer origin and while the article 2 is being transferred to the transfer destination), and is used as a confirmation of the transfer operation. In addition to the above detection, the respective detectors 14 can confirm the transfer destination of the article 2. The confirmation is performed before the transfer operation starts and is used to confirm whether or not the article 2 is already present at the transfer destination. Also, when there is issued an alarm alerting an abnormality in the transfer being performed at a high location of the storage rack 4, the confirmation performed by the respective detectors 14 can be used instead of the operator having to visually confirm the transfer state of the article 2. Thereby, for example, in an event of a disaster such as an earthquake, the state of the article 2 placed on the storage rack 4 can be confirmed quickly. In an event of a disaster such as an earthquake, there is a possibility that the article 2 may be displaced and fall off from the storage rack 4 or the storage rack 4 may even collapse and it is therefore necessary for the operator to avoid visual confirmation work. However, it is possible to easily and quickly confirm the article 2 stored on the storage rack 4 by confirming the presence/absence, the posture, or the position of the article 2 at the transfer destination.

As shown in FIG. 1, each of the detectors 14 is individually connected to the data bus 38. The respective detectors 14 each output data of the acquired images (hereinafter, referred to as "image data") to the data bus 38. The image data output from the plurality of detectors 14a to 14d are recorded in the recorder 36. The respective detectors 14 may perform predetermined image processing on the image data and may output the processed image data to the data bus 38. For example, the respective detectors 14 may output data in which the image data has undergone an image process such as a binarization process and a gray-scale process, or may output data in which the image data has undergone a compression process such as a lossless compression process and a lossy compression process.

As described above, since the detectors 14 acquire images of the transfer destination and the article 2 placed at the transfer destination and detect the posture of the article 2 or the position of the article 2 at the transfer destination on the basis of the images, the images contain more information related to the posture or the position of the article 2 compared to determination performed by sensors and, therefore, the detectors 14 can accurately determine the posture or the position of the article 2. Moreover, the detectors 14 perform detection on the basis of images as described above and, therefore, the transporter 1 can be applied to articles 2 of different sizes and shapes. Also, when the detectors 14 detect the posture of the article 2 or the position of the article 2 at the transfer destination on the basis of the images that captured the indicator 27 provided at the transfer destination and the characteristic portion 28 of the article 2, the detectors 14 perform detection on the basis of the indicator 27 and the characteristic portion 28 and, therefore, the detectors 14 can accurately detect the posture of the article 2 or the position of the article 2 at the transfer destination.

The manager 16 processes and manages the image data output from the image capturers 5 and the respective detectors 14. Also, the manager 16 performs control and so forth of the stocker controller 6. The manager 16 is arranged outside the housing 3. The manager 16 includes a display 34, an inputter 35, the recorder 36, the controller 37, and the data bus 38 used to transmit data of the respective parts. The display 34, the inputter 35, the recorder 36, and the controller 37 are each connected to the data bus 38 and mutually exchange data. The manager 16 is configured with a computer device including a CPU, a memory storage device such as a main memory and a hard disk, a wired or wireless communication device, an input device such as a keyboard or a mouse, and a display device such as a display. The computer device reads various programs stored in the memory storage device and executes processes according to the programs. The stocker controller 6 may also serve as a part of or the entire manager 16. The manager 16 may be arranged inside or outside the housing 3.

The display 34 is, for example, a liquid crystal display or the like, and displays various types of information output from the controller 37. The inputter 35 is an input device such as a keyboard and a mouse, and used to input various types of information to the manager 16. The recorder 36 is, for example, a memory storage device such as a hard disk, and records various types of data. The recorder 36 records (stores) image data and from the detectors 14.

The controller 37 controls the respective parts and performs processing of various types of data. The controller 37 includes an image processor 39 and a determiner 40. The controller 37 is connected to the stocker controller 6 to be capable of communicating therewith in a wired or wireless manner. The controller 37 need not be connected to the stocker controller 6.

The image processor 39 processes image data. The image processor 39 reads the image data recorded in the recorder 36 and performs image processing thereon. For example, an image processing program stored in the memory storage device causes a computer device to execute the above image processing thereon and causes the computer device to function as the image processor 39. The image processor 39 calculates the posture of the article 2 or the position of the article 2 at the transfer destination on the basis of a plurality of sets of image data. The image processor 39 may calculate the posture of the article 2 or the position of the article 2 at the transfer destination on the basis of a single piece of image data.

When calculating the posture of the article 2 or the position of the article 2 at the transfer destination, the image processor 39 first calculates data that indicates the characteristic portion 28 of the article 2 and the indicators 27, in the image data, on the basis of the image data acquired by the respective detectors 14. For example, the image processor 39 performs binarization processing on the image data and performs edge detection processing on the basis of the binarized image data. Subsequently, the image processor 39 calculates data that indicates the characteristic portion 28 and the indicators 27 by performing pattern matching processing on the image data that has undergone the edge detection processing. In the pattern matching processing, a portion similar to the pattern data of the characteristic portion 28 and the indicators 27 preliminarily stored in a memory storage device (not shown in the figure) of the manager 16 is detected from the image data that has undergone the edge detection processing. The method of the pattern matching processing is not particularly limited, and any optional method can be used.

Next, the image processor 39 calculates the posture of the article 2 or the position of the article 2 at the transfer destination on the basis of the data obtained from the pattern matching processing that indicates the characteristic portion 28 and the indicators 27. For example, when the characteristic portion 28 is the end part 2P (see FIG. 7), the image processor 39 calculates the distance La (Lc) between the end part 2P and the indicator 27a, the distance Lb (Ld) between the end part 2P and the indicator 27b, and the inclination of the end part 2P with respect to the horizontal plane. As a result, the relative position of the article 2 with respect to the indicators 27 is calculated, and the posture of the article 2 or the position of the article 2 at the transfer destination is calculated. When the characteristic portions 28 are the steps 2d, 2e (see FIG. 8), the image processor 39 calculates the positions (or the distances) of the steps 2d, 2e with respect to the indicators 27a, 27b (see FIG. 7), and the inclination of the step 2d with respect to the horizontal plane. For example, the image processor 39 performs the above edge detection processing and the pattern matching processing on the image data acquired by the +X side detectors 14a, 14c and calculates the inclination at the +X side indicator 27a and the +X side step 2d with respect to the horizontal plane. Moreover, the image processor 39 performs the edge detection processing and the pattern matching processing on the image data acquired by the −X side detectors 14b, 14d and calculates the inclination at the −X side indicator 27b and the −X side step 2e with respect to the horizontal plane. As a result, the relative position of the article 2 with respect to the indicators 27 is calculated, and the posture of the article 2 or the position of the article 2 at the transfer destination is calculated. Thus, when images of two of the steps 2d, 2e or two of the indicators 27a, 27b are acquired by the two corresponding detectors 14a, 14b (or the detectors 14c, 14d), the above processing can be performed more accurately. When there is no indicator 27, for example, the image processor 39 may calculate the posture of the article 2 or the position of the article 2 at the transfer destination, on the basis of the characteristic portion 28 only.

Next, the determiner 40 shown in FIG. 1 will be described. The determiner 40 determines whether or not the posture or the position of the article 2 at the transfer destination is within a preliminarily set appropriate range, on the basis of detection results of the detectors 14. For example, a determination program stored in the memory storage device causes a computer device to execute the processing and causes the computer device to function as the determiner 40. On the basis of the posture of the article 2 or the position of the article 2 at the transfer destination calculated by the image processor 39, the determiner 40 calculates the amount of displacement (hereinafter, simply referred to as "displacement amount") with respect to the article 2 in the state of being correctly placed at the transfer destination (for example, the position P1 shown in FIG. 7). The determiner 40 compares the calculated displacement amount against a preliminarily set threshold value and thereby determines whether or not the posture or the position of the article 2 at the transfer destination is within the preliminarily set appropriate range.

If the displacement amount is less than the threshold value, the determiner 40 determines the posture or the position of the article 2 at the transfer destination as being within the appropriate range. If the displacement amount is greater than or equal to the threshold value, the determiner 40 determines the posture or the position of the article 2 at the transfer destination as being outside the appropriate range. If the displacement amount is greater than or equal to the threshold value, the determiner 40 may determine the posture or the position of the article 2 at the transfer destination from several levels thereof according to the actual displacement amount. For example, the determiner 40 may determine the displacement amount as being large, medium, small, and so on, according to the actual displacement amount.

The determiner 40 performs the determination after the transporter 1 has transferred the article 2 to the transfer destination and before starts moving toward another transfer destination. As described above, when the determiner 40 performs the determination before the transporter 1 starts moving toward another transfer destination, the transporter 1 can quickly start moving toward another transfer destination. Moreover, the determiner 40 performs the determination every time when the transporter 1 places the article 2 at the transfer destination. When the determination is performed by the determiner 40 every time when the transporter 1 places the article 2 on the transfer destination, the transferred article can be reliably determined. The transporter 1 may be controlled to wait before moving toward another transfer destination until the determination being performed by the determiner 40 is completed. For example, the transporter 1 may transmit a signal indicating that the determination by the determiner 40 has been completed to the stocker controller 6, and the stocker controller 6, upon receiving the signal, may cause the transporter 1 to start moving toward another transfer destination. The timing at which the determiner 40 performs the determination is not limited to the timing described above, and the determination may be performed at an arbitrary timing.

When the determiner 40 determines the posture or the position of the article 2 at the transfer destination as being out of the appropriate range, the controller 37 performs a predetermined process. For example, the controller 37 may perform control so that a warning is displayed on the display 34 or on a display device (not shown in the figure) of the stocker controller 6. Also, when the determiner 40 determines the posture or the position of the article 2 as being out of the appropriate range, the controller 37 may perform control to issue a notification by driving a notification device such as a lamp that issues an alert. In such an example, the controller 37 may add information of the article indicating a transfer abnormality to the management information of the article managed by the stocker controller 6, and the stocker controller 6 may further perform control so that the transporter 1 does not transfer the article 2 to the location where the information indicating the transfer abnormality was added. As a result, it is possible to prevent an abnormal stop caused by the transporter 1 transferring the article 2 that has been placed abnormally. As described above, since the predetermined process is performed when the determiner 40 determines the posture or the position of the article 2 as being out of the appropriate range, it is possible to perform an appropriate process for the abnormally placed article 2. The controller 37 need not perform the predetermined process when the posture or the position of the article 2 is determined as being out of the appropriate range.

Figure 10:
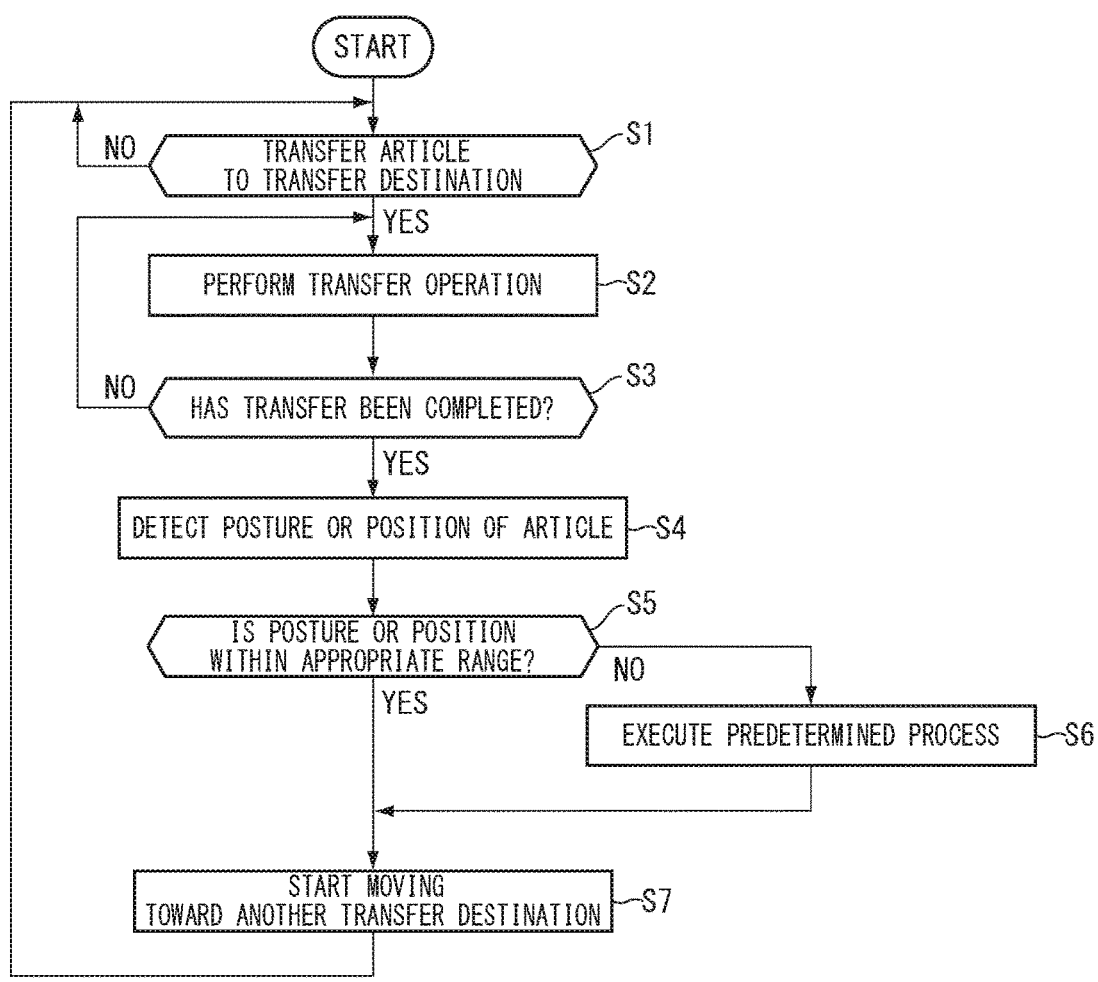
FIG. 10 is a flowchart showing an example of an operation of the transporter.

Next, a transporting method according to the example is described on the basis of an operation of the transporter 1. FIG. 10 is a flowchart showing an example of the operation of the transporter 1.

This transporting method is a transporting method in which an article is moved between a plurality of transfer destinations at which the articles can be placed, and the article is transferred to the transfer destination. In this transporting method, first, in Step S1, it is determined whether or not to transfer the article 2 to a transfer destination. For example, before or while transporting the article 2, the transporter 1 determines whether or not to transfer the article 2 to the transfer destination by the stocker controller 6.

When the stocker controller 6 determines not to transfer the article 2 to the transfer destination (NO in Step S1), the process returns to Step S1 and the determination as to whether or not to transfer the article 2 to the transfer destination is performed again. If the stocker controller 6 determines to transfer the article 2 to the transfer destination (YES in Step S1), the operation of transferring the article 2 (the placement operation) is performed in Step S2. The operation of transferring the article 2 to the transfer destination (the placement operation) is as described above. The determination in Step S1 to transfer the article 2 to the transfer destination may be performed when the stocker controller 6 instructs transportation of the article 2, or may be performed when the transporter 1 arrives at a predetermined position where the article 2 can be transferred to the target transfer destination.

Next, in Step S3, it is determined whether or not the transfer of the article 2 has been completed. For example, the stocker controller 6 determines whether or not the transporter 1 has completed the transfer operation of the article 2. For example, the stocker controller 6 determines whether or not the holder 21 described above has been lowered to the lowest point. If the stocker controller 6 determines the transfer operation as having not been completed (NO in Step S3), the process returns to Step S2 and the stocker controller 6 causes the transfer operation to be continued or to be performed again. If the stocker controller 6 determines the transfer operation as having been completed (YES in Step S3), that is, if the article 2 has been determined as having been placed at the transfer destination, in Step S4, the detectors 14 are controlled to detect, after the transporter 1 has transferred the article 2 to the transfer destination and before starts moving toward another transfer destination, the posture of the article 2 or the position of the article 2 at the transfer destination. For example, as described above, the respective detectors 14 (14a to 14d) detect the posture of the article 2 or the position of the article 2 at the transfer destination. After the article 2 has been placed at the transfer destination, the respective detectors 14 (14a to 14d) detect the posture of the article 2 or the position of the article 2 at the transfer destination. The respective detectors 14 (14a to 14d) detect the posture or the position of the transferred article 2, for example, immediately after the transfer of the article 2 to the transfer destination has been completed by the transferer 13, that is, at the point in time when YES is determined in Step S3. For example, the respective detectors 14 (14a to 14d) acquire images of the article 2 and the transfer destination at that point in time. For example, in the transfer operation described above, the respective detectors 14 (14a to 14d) detect the posture or the position of the transferred article 2 immediately after the holder 21 has moved to the lower side from the upper side of the cutout 32 and the transfer operation of the article 2 has been completed. The respective detectors 14 (14a to 14d) each image-capture a preliminarily set image-capturing range to thereby detect the posture or the position of the transferred article 2 by image-capturing the article 2. For example, the detectors 14a, 14c provided on the +X side image-capture and detect the +X side of the article 2 including the +X side step 2d and the +X side indicator 27a and, for example, the detectors 14b, 14d provided on the −X side image-capture and detect the −X side of the article 2 including the −X side step 2e and the −X side indicator 27b.

Next, in Step S5, it is determined whether or not the posture or the position of the article 2 at the transfer destination is within the preliminarily set appropriate range, on the basis of the detection results of the respective detectors 14 (14a to 14d). For example, as described above, the determiner 40 determines whether or not the posture or the position of the article 2 at the transfer destination is within the preliminarily set appropriate range, on the basis of the detection results of the detectors 14. The determiner 40 performs the determination before the transporter 1 starts moving toward another transfer destination. For example, the determiner 40 performs the determination after the article 2 has been placed at the transfer destination and before the transferer has returned to the waiting position from the state of being extended. Moreover, the determiner 40 performs the determination every time when the transporter 1 places the article 2 at the transfer destination.

If the determiner 40 determines the posture or the position of the article 2 as being within the appropriate range (YES in Step S5), in Step S7, the transporter 1 starts moving toward another transfer destination. For example, under the control of the stocker controller 6, the transporter 1 starts moving toward another transfer destination, and the process returns to Step S1 to determine whether or not to transfer the article 2 to the transfer destination. Moreover, if the determiner 40 determines the posture or the position of the article 2 as being out of the appropriate range (NO in Step S5), in Step S6, the predetermined process is performed. For example, the controller 37 may perform control so that a warning is displayed on the display 34 or on a display device (not shown in the figure) of the stocker controller 6, may perform control to issue a notification by driving a notification device such as a lamp that issues an alert, or may perform control to add information indicating an abnormality in the transfer of the article 2 to the management information managed by the stocker controller 6. In such an example, the stocker controller 6 may perform control so that the transporter 1 does not transfer the article 2 indicating the transfer abnormality. In such a way, the transfer state of the article 2 indicating the transfer abnormality can be confirmed at the timing of stopping the automated warehouse S or the transporter 1 for a maintenance purpose or the like and, as a result, the reduction can be suppressed in the productivity. Whether or not Step S6 is performed is optional.

As described above, in the transporter 1 and the transporting method of this example, it is possible to quickly and accurately detect the posture or the position of the article 2 placed on the storage rack 4 at an appropriate timing. In the transporter 1 and the transporting method of this example, by performing the detection by the detectors 14 and performing the determination by the determiner 40 in a series of the successive operations from Step S1 to Step S7 described above, it is possible to confirm whether or not the article 2 is correctly placed at the transfer destination when the article 2 has just been placed at the transfer destination.

Second Example

Figure 11:
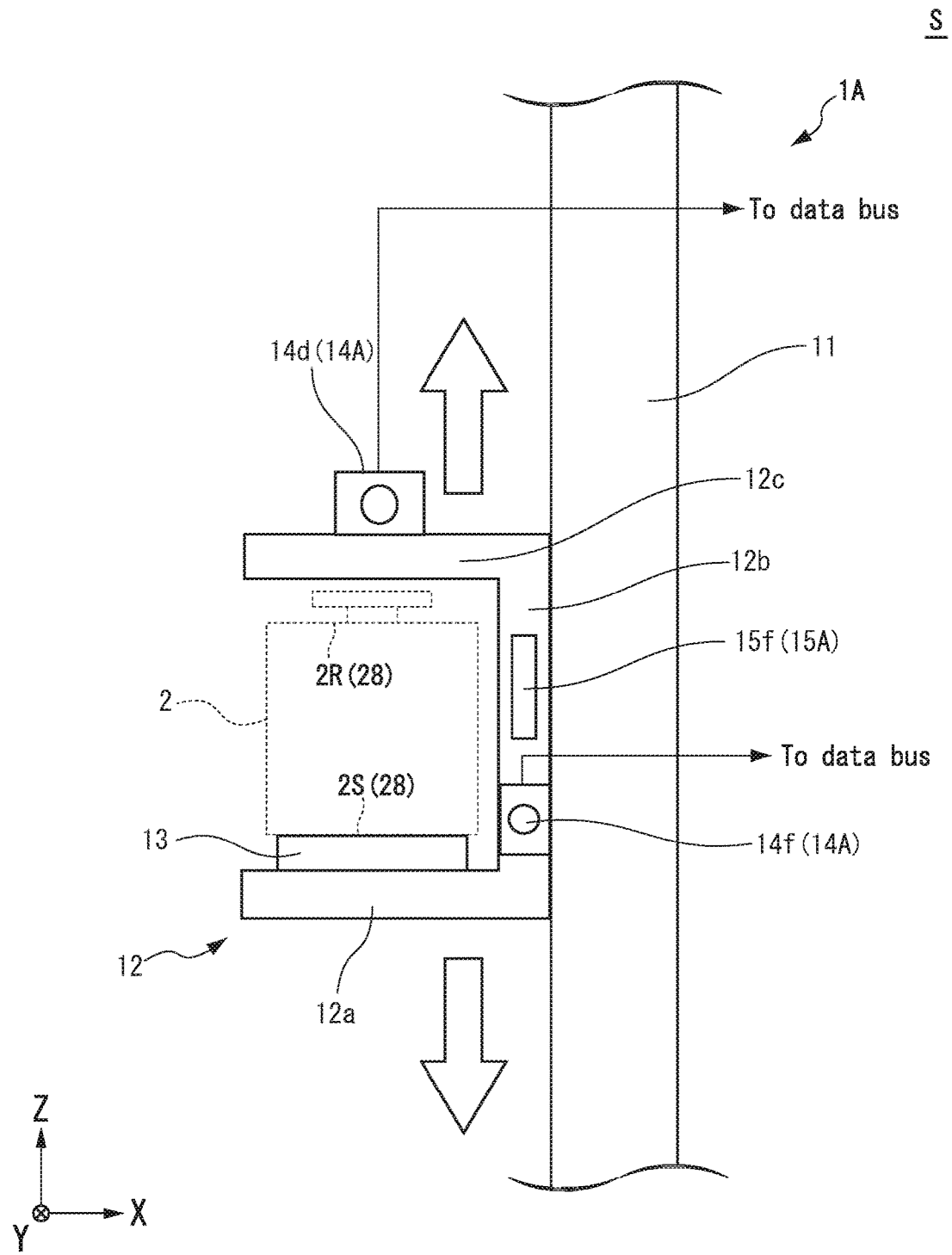
FIG. 11 is a front elevation view showing a transporter according to a second example.
Figure 12:
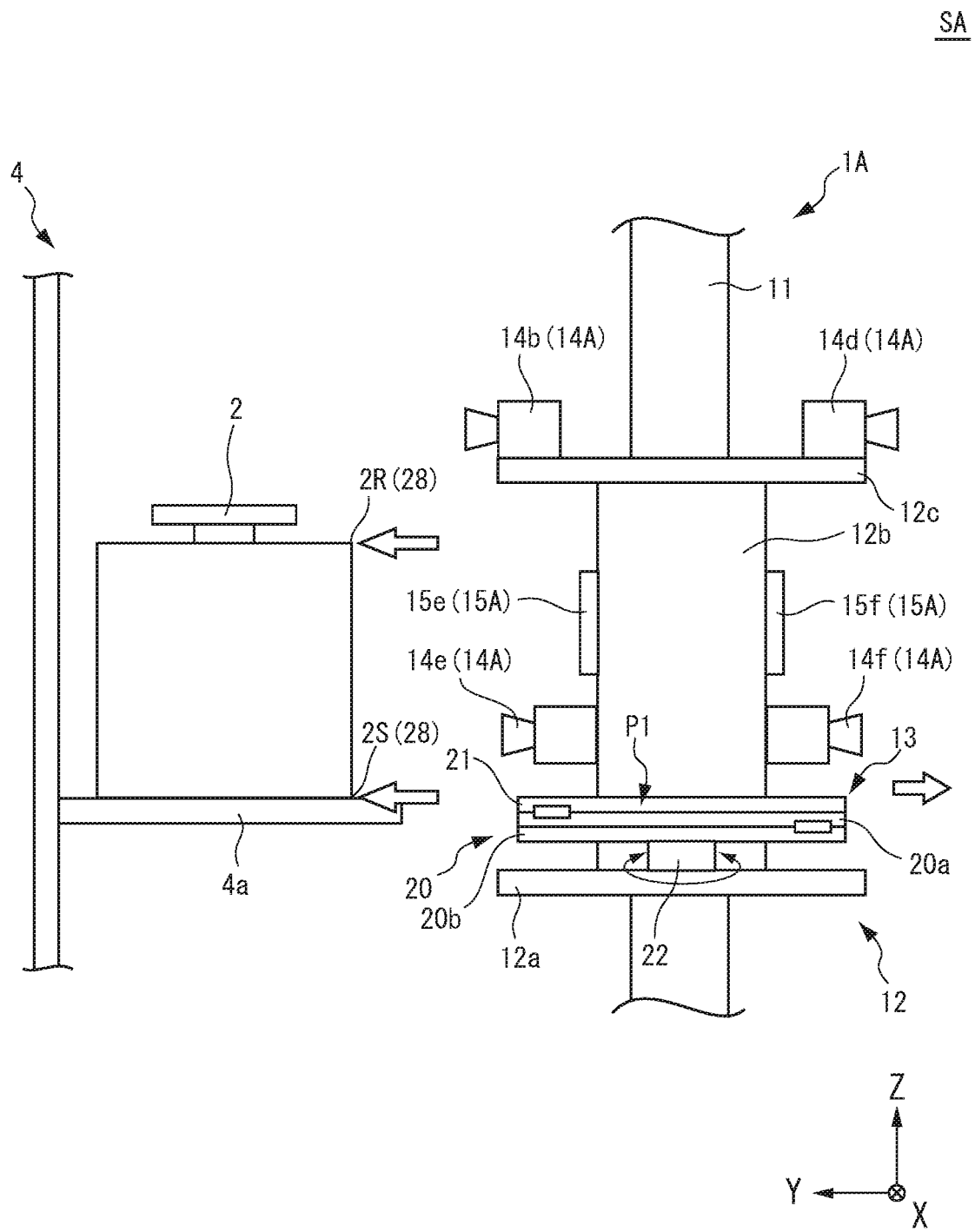
FIG. 12 is a side view showing the transporter of FIG. 11.

FIG. 11 is a diagram conceptually showing a transporter 1A according to a second example. FIG. 11 is a front elevation view of the transporter 1A as seen from the −Y side. FIG. 12 is a side view of the transporter 1A of FIG. 11 as seen from the −X side. The transporter 1A of the second example differs from the transporter 1 of the first example in the configuration of detectors 14A and illuminators 15A. The other configurations are the same as those of the first example, and are assigned with the same symbols and the descriptions thereof are omitted or simplified. Hereinafter, differences from the first example will mostly be described.

The transporter 1A of the second example is applied to an automated warehouse SA as in the first example. The automated warehouse SA includes the transporter 1A, the housing 3, the storage racks 4 (transfer destination), the image capturers 5, and the stocker controller 6. The automated warehouse SA is the same as the automated warehouse S of the first example except that the transporter 1A is included instead of the transporter 1 of the first example. Therefore, descriptions of the configurations other than the transporter 1A are omitted or simplified where appropriate.

The transporter 1A in FIG. 11 includes the traveling bodies 10 (see FIG. 1), the mast 11, the elevation platform 12, the transferer 13, the detectors 14A, the illuminators 15A, and the manager 16 (see FIG. 1). The transporter 1A is the same as the transporter 1 of the first example except that the detectors 14A and the illuminators 15A are included instead of the detectors 14 and the illuminators 15 of the first example. The descriptions of the same configurations as those in the transporter 1 are omitted or simplified where appropriate.

As shown in FIG. 12, the detectors 14A includes detectors 14*b*, 14*d*, 14*e*, 14*f*. The detectors 14*b*, 14*d* are arranged on the +Y side and the −Y side of the top plate 12*c*, respectively. The detectors 14*b*, 14*d* are arranged being oriented toward the +Y side and the −Y side and detect the +Y side and the −Y side respectively. The detectors 14*b*, 14*d* are arranged being oriented in the horizontal direction (in the direction parallel to the XY plane) respectively, and perform image-capturing in the horizontal direction. As shown in FIG. 11, the detector 14*d* is arranged in a center portion in the X direction of the top plate 12*c*. As with the detector 14*d*, the detector 14*b* is arranged in the center portion in the X direction of the top plate 12*c* (not shown in the figure). The detectors 14*b*, 14*d* each detect the upper part of the article 2 including an upper end part 2R of the main body 2*a* indicated by an arrow in FIG. 12. The upper end part 2R is in a direction parallel to the X direction. The upper end part 2R is set as a characteristic portion 28. Since the detectors 14*b*, 14*d* are oriented in the horizontal direction and the upper end part 2R is in the direction parallel to the X direction, the detectors 14*b*, 14*d* can accurately detect the upper end part 2R as a characteristic portion. The detectors 14*b*, 14*d* are respectively the same as the detectors 14*b*, 14*d* of the first example except for the points described above and, therefore, descriptions thereof will be omitted.

The detectors 14*e*, 14*f* are arranged on the +Y side and the −Y side of the strut 12*b*, respectively. The detectors 14*e*, 14*f* are oriented toward the +Y side and the −Y side and detect the +Y side and the −Y side respectively. The detectors 14*e*, 14*f* are oriented in the horizontal direction (in the direction parallel to the XY plane) respectively, and perform image-capturing in the horizontal direction. The detectors 14*e*, 14*f* each detect the lower part of the article 2 including a lower end part 2S of the main body 2*a* indicated by an arrow in FIG. 12. The lower end part 2S is in a direction parallel to the X direction. The lower end part 2S is set as a characteristic portion 28. Since the detectors 14*e*, 14*f* are oriented in the horizontal direction and the upper end part 2R is in the direction parallel to the X direction, the detectors 14*e*, 14*f* can accurately detect the upper end part 2R as a characteristic portion. The detectors 14*e*, 14*f* are respectively the same as the detectors 14*b*, 14*d* of the first example except for the points described above and, therefore, descriptions thereof will be omitted.

As shown in FIG. 12, the illuminators 15A include illuminators 15*e*, 15*f*. The illuminators 15*e*, 15*f* are arranged on the +Y side and the −Y side of the strut 12*b*, respectively. The illuminators 15*e*, 15*f* are oriented toward the +Y side and the −Y side and detect the +Y side and the −Y side, respectively. When the detectors 14A (14*b*, 14*d*, 14*e*, 14*f*)

(hereinafter, simply referred to as "respective detectors 14A") perform detection, the illuminators 15e, 15f illuminate the transfer destination and the article 2 placed at the transfer destination. The illuminators 15e, 15f are respectively the same as the illuminators 15b, 15d of the first example except for the points described above and, therefore, descriptions thereof will be omitted.

Next, acquisition of images of the article 2 performed by the respective detectors 14A will be described. The respective detectors 14A each acquire images of at least the elevation platform 12 side of the article 2 placed on the storage rack 4 (the +Y side in FIG. 12) and the elevation platform 12 side of the storage rack 4. The respective detectors 14A each detect the posture of the article 2 or the position of the article 2 at the transfer destination, on the basis of the images that captured indicators 27 and characteristic portions 28 of the article 2 (the upper end part 2R and the lower end part 2S).

The upper end part 2R and the lower end part 2S serving as the characteristic portions 28 are linearly image-captured by the respective detectors 14A. In contrast to when the article 2 is correctly positioned, when the article 2 is displaced in the vertical direction, the upper end part 2R and the lower end part 2S are detected as being inclined with respect to the horizontal plane. On the basis of the amount of the difference, the displacement of the article 2 in the vertical direction can be quantitatively detected.

Moreover, since the lower end part 2S is linear in the images captured by the detectors 14e, 14f, it is possible to detect the posture of the article 2 or the position of the article 2 at the transfer destination, using the lower end part 2S and the indicators 27, as with the method in the first example in which the end part 2P and the indicator 27 are used. When the article 2 is placed at the correct position P1 shown in FIG. 7, the distance between the indicator 27a and the lower end part 2S and the distance between the indicator 27b and the lower end part 2S are the same predetermined value. On the other hand, when the article 2 is placed at the position P2 that is displaced in the horizontal direction (in the XY-plane direction in FIG. 7) from the correct position P1 shown in FIG. 7, the distance between the indicator 27a and the lower end part 2S and the distance between the indicator 27b and the lower end part 2S are different values. In such an example, displacement of the article 2 in the horizontal direction can be quantitatively detected on the basis of the distance between the indicator 27a and the lower end part 2S and the distance between the indicator 27b and the lower end part 2S.

The respective detectors 14A detect, after the transporter has transferred the article to the transfer destination and before starts moving toward another transfer destination, the posture of the article 2 or the position of the article 2 at the transfer destination. The respective detectors 14A detect the posture or the position of the transferred article 2, for example, immediately after transfer of the article 2 to the transfer destination has been completed by the transferer 13.

Next, the image processor 39 and the determiner 40 will be described. As with the first example, the image processor 39 calculates data that indicates the upper end part 2R and the lower end part 2S, which are the characteristic portions 28 of the article 2, and the indicators 27, in the image data, on the basis of the image data acquired by the respective detectors 14A. For example, the image processor 39 performs binarization processing on the image data and performs edge detection processing on the basis of the binarized image data. Subsequently, the image processor 39 calculates data that indicates the characteristic portion 28 and the indicators 27 by performing pattern matching processing on the image data that has undergone the edge detection processing.

For example, the image processor 39 quantitatively detects the displacement of the article 2 in the vertical direction on the basis of the inclination of the upper end part 2R and the lower end part 2S with respect to the horizontal plane. As a result, the posture of the article 2 is calculated. Moreover, the image processor 39 quantitatively detects the displacement of the article 2 in the horizontal direction on the basis of the distance between the indicator 27a and the lower end part 2S and the distance between the indicator 27b and the lower end part 2S. As a result, the relative position of the article 2 with respect to the indicators 27 is calculated, and the posture of the article 2 or the position of the article 2 at the transfer destination is calculated.

As with the first example, on the basis of the posture of the article 2 or the position of the article 2 at the transfer destination calculated by the image processor 39, the determiner 40 calculates the amount of displacement with respect to the article 2 in the state of being correctly placed at the transfer destination (for example, the position P1 shown in FIG. 7). The determiner 40 compares the calculated displacement amount to a preliminarily set threshold value and thereby determines whether or not the posture or the position of the article 2 at the transfer destination is within the preliminarily set appropriate range.

Operation of the transporter 1A is the same as that of the first example except for the above points. As a result, the posture or the position of the transferred article 2 is detected and it is determined whether or not the detected posture or position is within the appropriate range.

As described above, in the transporter 1A of this example, it is possible to quickly and accurately detect the posture or the position of the article 2 placed on the storage rack 4 at an appropriate timing.

The technical scope of this disclosure is not limited to the mode described in the above examples. One or more of the requirements described in the above examples may be omitted. The requirements described in the above examples may be appropriately combined. In addition, the contents of Japanese Patent Application No. 2016-198633 and all documents cited herein are incorporated herein by reference to the extent permitted by law.

Furthermore, the configuration of the detectors 14 is not limited to the configuration shown in FIG. 2, and another configuration may be employed. For example, at least one of the detectors 14a to 14d may be provided oriented in the horizontal direction. Also, the detectors 14 are not limited to being provided in a set of two on each of the +Y side and the −Y side of the elevation platform 12, and it is sufficient that at least one detector 14 is provided on each of the +Y side and the −Y side of the elevation platform 12. For example, either one of the set of detectors 14a, 14c and the set of the detectors 14b, 14d may be omitted.

Furthermore, the configuration of the detectors 14A is not limited to the configuration shown in FIG. 12, and another configuration may be employed. For example, at least one of the detectors 14b, 14d, 14e, 14f may be provided oriented upward (image-capturing may be performed from diagonally below), or may be provided oriented downward (image-capturing may be performed from diagonally above). Also, the detectors 14A are not limited to being provided in a set of two on each of the +Y side and the −Y side of the elevation platform 12, and it is sufficient that at least one detector 14 is provided on each of the +Y side and the −Y side of the elevation platform 12. For example, either one of the set of detectors 14*b*, 14*d* and the set of the detectors 14*e*, 14*f* may be omitted.

The configuration of the illuminators 15 is not limited to the configuration shown in FIG. 2, and another configuration may be employed. For example, the number of each of the illuminators 15 (15*a* to 15*d*) is not limited to one, and may be two or more. Also, the number of the illuminators 15*a* and the number of the illuminators 15*b* may be different from each other. The positions of the illuminators 15 are not limited to the positions shown in FIG. 2, and another configuration may be employed. For example, the positions of the illuminators 15 may be the positions of the illuminator 15*e* and the illuminator 15*f* shown in FIG. 12.

The configuration of the illuminators 15A is not limited to the configuration shown in FIG. 12, and another configuration may be employed. For example, as shown in FIG. 6, the illuminators 15A may be arranged on the top plate 2*c* and may be oriented downward.

The transporters 1, 1A shown in FIG. 1 described above are merely examples, and another configuration may be employed. For example, the number of the mast 11 of the transporters 1, 1A is not limited to one, and may be two, for example.

The automated warehouses S, SA shown in FIG. 1 described above are merely examples, and another configuration may be employed. For example, in the automated warehouse S, at least one of the housing 3 and the image capturing devices 5 may be omitted.

The manager 16 shown in FIG. 1 described above are merely examples, and another configuration may be employed. For example, in the manager 16, at least one of the display 34 and the inputter 35 may be omitted.

The invention claimed is:

1. A transporter that moves between a plurality of transfer destinations at which articles can be placed, and transfers the article to the transfer destination, the transporter comprising:
    a transferer capable of extending to or retracting from the transfer destination, and that places the article at the transfer destination in a state of having extended to the transfer destination from a waiting position;
    a detector that detects, after the transporter has transferred the article to the transfer destination, before the transporter starts moving toward another transfer destination, and before the transporter has returned to the waiting position, a posture or a position of the article; and
    a determiner that determines whether or not the posture or the position of the article is within a preliminarily set appropriate range, on the basis of detection results of the detector.

2. The transporter according to claim 1, wherein a predetermined process is performed when the determiner determines the posture or position of the article as being out of the appropriate range.

3. The transporter according to claim 1, wherein the determiner performs determination after the transporter has transferred the article to the transfer destination and before starting to move toward another transfer destination.

4. The transporter according to claim 3, wherein the detector performs detection every time the transporter places the article at the transfer destination, and the determiner performs determination every time the transporter places the article at the transfer destination.

5. The transporter according to claim 3, wherein the transferer is provided on an elevation platform that can be lifted or lowered, and the detector is provided on the elevation platform.

6. The transporter according to claim 3, wherein the detector acquires images of the transfer destination and the article placed at the transfer destination, and detects the posture or position of the article, on the basis of the images.

7. The transporter according to claim 1, wherein the detector performs detection every time the transporter places the article at the transfer destination, and the determiner performs determination every time the transporter places the article at the transfer destination.

8. The transporter according to claim 7, wherein the transferer is provided on an elevation platform that can be lifted or lowered, and the detector is provided on the elevation platform.

9. The transporter according to claim 7, wherein the detector acquires images of the transfer destination and the article placed at the transfer destination, and detects the posture or position of the article, on the basis of the images.

10. The transporter according to claim 7, wherein a predetermined process is performed when the determiner determines the posture or position of the article as being out of the appropriate range.

11. The transporter according to claim 1, wherein the transferer is provided on an elevation platform that can be lifted or lowered, and the detector is provided on the elevation platform.

12. The transporter according to claim 11, wherein the detector acquires images of the transfer destination and the article placed at the transfer destination, and detects the posture or position of the article, on the basis of the images.

13. The transporter according to claim 11, wherein a predetermined process is performed when the determiner determines the posture or position of the article as being out of the appropriate range.

14. The transporter according to claim 1, wherein the detector acquires images of the transfer destination and the article placed at the transfer destination, and detects the posture or position of the article, on the basis of the images.

15. The transporter according to claim 14, further comprising an illuminator that illuminates the transfer destination and the article placed at the transfer destination.

16. The transporter according to claim 15, wherein the detector detects the posture or position of the article, on the basis of the images that captured indicators provided at the transfer destination and a characteristic portion of the article.

17. The transporter according to claim 14, wherein the detector detects the posture or position of the article, on the basis of the images that captured indicators provided at the transfer destination and a characteristic portion of the article.

18. The transporter according to claim 17, wherein a predetermined process is performed when the determiner determines the posture or position of the article as being out of the appropriate range.

19. A transporting method in which an article is moved by a transporter between a plurality of transfer destinations at which articles can be placed, and the article is transferred to the transfer destination by a transferer included in the transporter, and in which the transferer is capable of extending to or retracting from the transfer destination, and places the article at the transfer destination in a state of being extended to the transfer destination from a waiting position, the transporting method comprising:
    detecting, after the transporter has placed the article to the transfer destination, before the transporter starts moving toward another transfer destination, and before the transporter has returned to the waiting position, a posture or a position of the article; and determining whether or not the posture or position of the article is within a preliminarily set appropriate range, on the basis of the detection results.

\* \* \* \* \*